(12) United States Patent
Sayama et al.

(10) Patent No.: US 6,281,558 B1
(45) Date of Patent: Aug. 28, 2001

(54) SEMICONDUCTOR DEVICE AND MANUFACTURING METHOD THEREOF

(75) Inventors: Hirokazu Sayama; Masao Nishida, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/126,279

(22) Filed: Jul. 30, 1998

(30) Foreign Application Priority Data

Mar. 26, 1998 (JP) .................................................. 10-079106

(51) Int. Cl.[7] .................................................. H01L 29/76
(52) U.S. Cl. ..................... 257/391; 257/371; 257/396; 257/397
(58) Field of Search ...................... 257/391, 392, 257/368, 371, 344, 345, 395, 396, 397, 408

(56) References Cited

U.S. PATENT DOCUMENTS 5,966,621 * 10/1999 Chan ..................................... 438/456
5,976,934 * 11/1999 Hayakawa ............................ 438/258
6,020,242 * 2/2000 Tsai et al. ............................ 438/279

OTHER PUBLICATIONS

Catherine Y. Wong, et al., "Sidewall Oxidation of Polycrystalline–Silicon Gate," IEEE Electron Device Letters, vol. 10, No. 9, Sep. 1989, pp. 420–422.

* cited by examiner

Primary Examiner—Sara Crane
(74) Attorney, Agent, or Firm—Oblon, Spivak, McClelland, Maier & Neustadt, P.C.

(57) ABSTRACT

A high-voltage element (H)to which a high gate voltage is applied, and a low-voltage element (L) to which a low gate voltage is applied, are formed in a semiconductor substrate (1). Bird's beaks (8, 18) are formed in gate insulating films (7, 17) by thermal oxidation. Since a gate electrode (9) of the element (H) has a shorter gate length than a gate electrode (19) of the element (L), the ratio of the bird's beak in the gate insulating films (7, 17) is small in the element (L) and large in the element (H). Therefore, the element (H) has a high breakdown voltage and less aged deterioration, leading to long lifetime. The element (L) has a high current driving capability to produce high-speed operation. Thus, long lifetime, high operation speed and easy manufacturing steps are realized at the same time.

8 Claims, 24 Drawing Sheets

SEMICONDUCTOR DEVICE AND MANUFACTURING METHOD THEREOF

BACKGROUND OF THE INVENTION

1. Field of the Invention

The present invention relates to a semiconductor device having a plurality of insulating gate elements and a manufacturing method thereof. In particular, the invention involves an improvement in simultaneous realization of high-speed operation, long lifetime and the ease of manufacturing method.

2. Description of the Background Art

In semiconductor devices, such as LSIs with a plurality of MOS transistors, there are, for example, employed plural types of gate voltages for MOS transistor. In a certain type of DRAM, two types of MOS transistors of different gate voltage are provided on a memory cell and a peripheral circuit. Since the memory cell is required to instantly charge or discharge electric charge to a capacitor therein, a gate voltage higher than that to the peripheral circuit is applied.

FIG. 40 is a cross-sectional view of a conventional semiconductor device having two types of MOS transistors of different gate voltage as described above. In the conventional semiconductor device 151, a high-voltage element H to which a high gate voltage is applied, and a low-voltage element L to which a gate voltage lower than that to the element H is applied, are formed in a single semiconductor substrate 71. The elements H and L are both MOS transistors and are electrically isolated from other elements adjoining them, by an element isolator 76 formed in the upper major surface of the substrate 71.

In the upper major surface of the substrate 71, P type wells 72 and 82 extend over the entire regions of the elements H and L, respectively, around the element isolator 76. N type source/drain regions 73 and 83 are selectively formed on the exposed surfaces of the P type wells 72 and 82, respectively, around each central portion of the exposed surfaces. Gate insulating films 77 and 87 overlie their respective central portions, and gate electrodes 79 and 89 overlie the gate insulating films 77 and 87, respectively. A source electrode 80 and a drain electrode 81 are connected to the exposed surface of the source/drain regions 73. Similarly, a source electrode 90 and a drain electrode 91 are connected to the exposed surface of the source/drain region 83.

Since a high gate electrode is applied to the high-voltage element H, an electric field higher than that to the low-voltage element L is applied to the gate insulating film 77. Therefore, the gate insulating film 77 is required to have a thickness of large enough to withstand such a high electric field and to suppress the aged deterioration that is closely related to the electric field. On the other hand, the gate insulating film 87 is not required to be so thick as the gate insulating film 77 because the electric field applied thereto is low.

In cases where a device 151 is a DRAM, a high-voltage element H belongs to a memory cell, and a low-voltage element L belongs to a peripheral circuit, the element L is not required to withstand so high gate voltage as the element H, but required to have a high current driving capability in order to realize high-speed operation. In general, the current driving capability of MOS transistors increases with decreasing thickness of a gate insulating film.

Unfortunately, since in the semiconductor device 151 the gate insulating film 87 of the low-voltage element L has the same thickness as the gate insulating film 77, there are more margin than is necessary for suppressing the aged deterioration and ensuring a long lifetime, while it fails to exhibit a sufficient current driving capability to be a factor which can inhibit high-speed operations. Thus, with the device 151, the long lifetime and high-speed operation compatibility is not accomplished.

This problem can arise not only when a device 151 is configured as a DRAM, but also when it is other semiconductor device. For example, In semiconductor devices having an exterior power input portion that receives the input of an external power voltage to generate, as an internal voltage, a power voltage lower than the external power supply voltage, a relatively high voltage is applied to MOS transistor that belongs to the external power input portion, as a gate voltage, and a relatively lower voltage is applied to MOS transistor that receives the supply of an internal power supply.

To overcome this problem, as shown in FIG. 41, there has been proposed a semiconductor device 152, which is referred to as "dual oxide" type. In the device 152, a gate insulating film 92 of a low-voltage element L is thinner than a gate insulating film 77 of a high-voltage element H. That is, all elements do not have a uniform gate insulating film thickness. The thickness is set individually, depending on the necessary breakdown voltage and current driving capability. Therefore, the high-voltage element H insures a high breakdown voltage and a long lifetime, and the low-voltage element L insures a high current driving capability, thereby establishing the long lifetime and high-speed operation compatibility.

Unfortunately, the semiconductor device 152 has another problem that as shown in the manufacturing steps in FIGS. 42 to 47, its manufacturing method is not easy and thus difficult to put it into practice. To obtain a device 152, firstly the step shown in FIG. 42 is conducted. Specifically, after a semiconductor substrate 71 is prepared, an element isolator 76 and wells 72 and 82 are formed in the upper major surface of the substrate 71. The wells 72 and 82 are respectively formed in the region whereat it is desired to form a high-voltage element H or a low-voltage element L in the regions surrounded by the element isolator 76.

Referring to FIG. 43, insulating films 93, 94 are formed over the upper major surface of the semiconductor substrate 71, i.e., over the entire exposed surfaces of the wells 72 and 82, respectively.

Referring to FIG. 44, there is formed a shield 95 that has an opening in the insulating film 93 and selectively covers the insulating film 94.

Referring to FIG. 45, an insulating film is further stacked on the portion as not being shielded by the shield 95, i.e., on the insulating film 93. As a result, the insulating film 93 is selectively thickened, whereas the insulating film 94 remains as it is.

Referring to FIG. 46 and 47, after the shield 95 is removed, gate electrodes 79 and 89 are formed on the insulating films 93 and 94, respectively.

Thereafter, N type impurity is selectively implanted with the gate electrodes 79 and 89 acting as a shield (this step is not shown), so that source/drain regions 73 and 83 are selectively formed on the exposed surfaces of the wells 72 and 82, respectively, as shown in FIG. 41. Then, a source electrode 80 and a drain electrode 81 are formed on the exposed surfaces of source/drain regions 73 so as to surround the gate electrode 79. At the same time, a source electrode 90 and a drain electrode 91 are formed on the exposed surfaces of source/drain regions 83 so as to surround the gate electrode 89, resulting in a semiconductor device 152.

As set forth above, in manufacturing a device 152, it is necessary to form a gate insulating film 77 through two-stage process in which a shield 95 having a selective opening is formed and then employed as described. This complicates the manufacturing steps, and it seems to be difficult to put it into practice because of problems involved in yield.

SUMMARY OF THE INVENTION

According to a first aspect of the present invention, a semiconductor device having a plurality of elements disposed in a semiconductor substrate, each one of the elements comprises: (a) a first semiconductor region of a first conductivity type formed in the semiconductor substrate so as to selectively expose to a major surface defined by the semiconductor substrate; (b) a pair of second semiconductor regions of a second conductivity type that are selectively formed apart from each other in the semiconductor substrate so as to selectively expose to the major surface around an exposed surface of the first semiconductor region; (c) a gate insulating film disposed on the exposed surface of the first semiconductor region; and (d) a gate electrode disposed on the gate insulating film. This semiconductor device is characterized in that: the elements are grouped into a plurality of groups, each group containing at least one of the elements; a gate length that is a length of the gate electrode in a direction from one of the second semiconductor regions to the other, is shorter in a second group than in a first group of the groups; the gate insulating film belonging to the each one of the elements has a pair of bird's beaks that are thick portions extending from both edges to a central portion along the direction in a region directly beneath the gate electrode; the gate insulating film has a portion being thinner than the bird's beaks and surrounded thereby, in at least the first group; and a ratio of the bird's beaks in the region directly beneath the gate electrode is larger in the second group than the first group.

According to a second aspect, the semiconductor device of the first aspect in characterized in that: each one of the elements further comprises a pair of extension regions of the second conductivity type selectively formed apart from each other in the semiconductor substrate, the pair of extension regions covering bottoms of the bird's beaks and selectively exposing to a boundary surface between the bottoms and the substrate; and the pair of extension regions have a shallower bottom and a lower impurity concentration than the pair of second semiconductor regions.

According to a third aspect, the semiconductor device of the first aspect is characterized in that the pair of second semiconductor regions cover bottoms of the bird's beaks, respectively.

According to a fourth aspect, the semiconductor device of the first aspect is characterized in that the ratio is 100% in the second group.

According to a fifth aspect, the semiconductor device of the first aspect is characterized in that each one of the elements further comprises a nitrogen introduced region containing nitrogen, the nitrogen introduced region being selectively formed in the semiconductor substrate so that it selectively exposes to exposed surfaces of the pair of second semiconductor regions and to a boundary surface between bottoms of the bird's beaks and the substrate.

According to a sixth aspect, the semiconductor device of the first aspect is characterized in that exposed surfaces of the pair of second semiconductor regions in at least one of the first and second groups are located higher than bottoms of the bird's beaks, in a region apart from directly beneath the bird's beaks.

According to a seventh aspect, the semiconductor device of the first aspect is characterized in that each one of the elements that belongs to at lease one of the first and second groups further comprises a semiconductor metal compound layer formed on exposed surfaces of the pair of second semiconductor regions, and a pair of major electrodes connected, through the compound layer, to the pair of second semiconductor regions, respectively.

According to an eight aspect, the semiconductor device of the first aspect is characterized in that the gate electrode is substantially composed of a conductive material having a high resistance to thermal reaction than the substrate.

According to a ninth aspect, a method for forming a semiconductor device comprises the steps of: (a) providing a semiconductor substrate defining a major surface to which a first semiconductor region of a first conductivity type expose; (b) forming an insulating film on the major surface; (c) depositing a conductive material on the insulating film; (d) selectively removing the conductive material so that a gate electrode is formed on each one of plural regions along the major surface, the regions being grouped into plural groups each containing at least one of the regions, and so that a gate length of the gate electrode is shorter in a second group than in a first group of the groups; (e) conducting a thermal reaction treatment so that part of the insulating film not covered with the gate electrode is thickened in each one of the plural regions, a thickened portion is allowed to intrude into a region directly beneath the gate electrode as a pair of bird's beaks, at least the first group has a portion free from the bird's beaks in the region directly beneath the gate electrode, and a ratio of the bird's beaks in the region directly beneath the gate electrode is larger in the second group than in the first group; and (f) selectively implanting, at least after step (d), an impurity of a second conductivity type into the major surface with the gate electrode acting as at least major part of a shield, to form a pair of second semiconductor regions in the semiconductor substrate so that they are apart from each other and selectively expose to the major surface around an exposed surface of the first semiconductor region directly beneath the gate electrode in each one of the plural regions.

According to a tenth aspect, the method of the ninth aspect further comprises step (g), between steps (d) and (e), of selectively implanting an impurity of a second conductivity type into the major surface with the gate electrode acting as a shield, to selectively form a pair of extension regions of the second conductivity type in the substrate so that they selectively expose to entire region of the major surface in which the insulating film is thickened in each one of the plural regions, and they have a shallower bottom and a lower impurity concentration than the pair of second semiconductor regions.

According to an eleventh aspect, the method of the ninth aspect is characterized in that in step (f) the impurity is implanted with the gate electrode acting as the shield, to selectively form the pair of second semiconductor regions so as to selectively expose to entire region of the major surface in which the insulating film is thickened.

According to a twelfth aspect, the method of the ninth aspect is characterized in that in step (e) the thermal reaction treatment is conducted so that the ratio is 100% in the second group.

According to a thirteenth aspect, the method of the ninth aspect further comprises step (h), between steps (d) and (e), of selectively implanting nitrogen into the major surface with the gate electrode acting as a shield, to selectively form a nitrogen implanted region containing nitrogen in the substrate so that it selectively exposes to entire region of the major surface in which the insulating film is thickened in each one of the plural regions.

According to a fourteenth aspect, the method of the ninth aspect further comprises step (i), between (e) and (f), of conducting a selective etching with the gate electrode acting as a shield, to selectively remove the part in which the insulating film is thickened in each one of the plural regions.

According to a fifteenth aspect, the method of the ninth aspect further comprises step (i), between (e) and (f), conducting a selective etching with the gate electrode acting as a shield, so that a thickened part of the insulating film in each one of the plural regions is selectively thinned.

According to a sixteenth aspect, the method of the ninth aspect further comprises step (i), between (e) and (f), conducting a selective etching to one of the first and second groups with the gate electrode acting as a shield, so that a thickened part of the insulating film is selectively removed.

According to a seventeenth aspect, the method of the ninth aspect further comprises the steps of: (i) conducting, at least after step (e), a selective etching with the gate electrode acting as a shield, to selectively thin the thickened part of the insulating film in each one of the plural regions; and (j) conducting, between (f) and (i), a selective etching to one of the first and second groups with the gate electrode acting as a shield, to selectively remove a thinned part of the insulating film.

According to an eighteenth aspect, the method of the ninth aspect further comprises the steps of: (i) conducting, at least after step (e), a selective etching to one of the first and second groups with the gate electrode acting as a shield, to selectively remove a thickened part of the insulating film; and (j) depositing, between steps (f) and (i), a semiconductor layer on the major surface of the substrate exposing to part from which the insulating film has been removed, so that the major surface projects from the part.

According to a nineteenth aspect, the method of the ninth aspect further comprises the steps of: (k) forming, at least after step (e), a semiconductor metal compound layer on part of the major surface whereat the pair of second semiconductor regions should be formed in at least one of the first and second groups; and (l) forming, after steps (f) and (k), a pair of major electrodes connecting, through the compound layer, to the pair of second semiconductor to regions, respectively.

According to a twentieth aspect, the method of the ninth aspect is characterized in that the conductive material deposited in step (c) has a higher resistance to thermal reaction than the substrate.

In the device of the first aspect, the ratio of a thin portion in the gate insulating film that is an insulating film directly beneath the gate electrode, is larger in the first group element than in the second group element. Therefore, both high-speed operation and long lifetime can be realized by employing the first group element as the element for which high current driving capability is required, and the second group element as the element for which high breakdown voltage is required. In addition, since the first and second group elements have a different gate length, the above-mentioned ratio is readily set different by means of the known simple method in which the bird's beaks are formed by thermal reaction treatment. This facilitates manufacturing of this device, without need for a complex step.

In the device of the second aspect, the region directly beneath the bird's beaks is covered with extension regions, thereby suppressing an increase in gate threshold voltage arising from a gate insulating film being thick in the bird's beak portion. In addition, the bottom of the extension regions are shallower than the second semiconductor regions, thereby improving the resistance to punch through of the device.

In the device of the third aspect, since the pair of second semiconductor regions cover the bottom of the bird's beaks, it is possible to suppress the gate threshold voltage from increasing, without forming extension regions.

In the device of the fourth aspect, since the bird's beaks occupy the entire gate insulating film in the second group, the aged deterioration of the second group element can be suppressed further effectively.

In the device of the fifth aspect, the presence of the nitrogen introduced region enables to mitigate the phenomenon that during forming the bird's beaks the semiconductor substrate is eroded to sink the bird's beaks. This provides a shallow second semiconductor region and thus further increases the resistance to punch through.

In the device of the sixth aspect, the exposed surface of the second semiconductor regions apart from the region directly beneath the pair of bird's beaks are located higher than the bottom of the bird's beaks, which accordingly allows to reduce the depth of the second semiconductor region on a basis of the bottom of the bird's beaks. This further improves the resistance to punch through.

In the device of the seventh aspect, the connection between the pair of major electrodes and the pair of second semiconductor regions, provides MOS transistor as at least part of a plurality of elements. In addition, since major electrodes are connected to the second semiconductor regions through a semiconductor compound layer, the contact resistance therebetween is reduced to increase the current driving capability and operation speed. In particular, when this device is combined with that of the seventh aspect, and a semiconductor metal compound layer is formed on the second semiconductor regions whose exposed surface is high, without making the second semiconductor regions shallow by the elevated amount of the exposed surface, it is possible to suppress the deterioration of junction characteristics between the first and second semiconductor regions due to a spike that may occur in forming a semiconductor compound layer.

In the device of the eighth aspect, since the gate electrode is composed of a conductive material having a high resistance to thermal reaction than the semiconductor substrate, it is possible to use a method in which the bird's beaks are formed by thermal reaction treatment, without taking into consideration a reduction in the conductive material thickness. Thus, the device is obtained much more easily.

In the method of the ninth aspect, with a difference in gate length between two regions, a known thermal reaction treatment is conducted to allow the bird's beaks to enter the region directly beneath the gate electrode, so that the regions readily have a different ratio of a thickened part of the gate insulating film. This makes it easy to obtain the device of the first aspect.

In the method of the tenth aspect, extension regions are readily formed by an impurity implantation with the gate electrode acting as a shield. This makes it easy to obtain the device of the second aspect.

In the method of the eleventh aspect, the second semiconductor regions are formed so as to cover the bottom of the bird's beaks by an impurity implantation with the gate electrode acting as a shield. This makes it easy to obtain the device of the third aspect.

In the method of the twelfth aspect, a thermal reaction treatment is conducted so that the bird's beaks occupy the entire gate insulating film in the second group. This enables to obtain the device of the fourth aspect in a simple manner.

In the method of the thirteenth aspect, with the gate electrode acting as a shield, nitrogen is implanted to form the nitrogen introduced region. The insulating film is thickened on the exposed surface of the nitrogen introduced region, in order to suppress the sinking of the thickened part, which correspondingly makes shallow the second semiconductor regions formed thereafter, thus increasing the resistance to punch through of the device. This method therefore readily provides the device of the fifth aspect.

In the method of the fourteenth aspect, an impurity implantation for forming the second semiconductor regions is performed after the thickened part of the insulating film is selectively removed, and therefore, the implantation can be executed at a low energy. This suppresses the second semiconductor regions from extending, resulting in a device excellent in the resistance to punch through.

In the method of the fifteenth aspect, an impurity implantation for forming the second semiconductor regions is performed after the thickened part of the insulating film is selectively thinned, and therefore, the implantation can be executed at a low energy. This suppresses the second semiconductor region from extending, resulting in a device excellent in the resistance to punch through. In addition, the remaining insulating film prevents the second semiconductor region from being contaminated, thus improving the junction characteristics.

In the method of the sixteenth aspect, an impurity implantation for forming the second semiconductor regions is performed after the thickened part of the insulating film is selectively removed in either first or second group, and therefore, the implantation can be executed at a low energy in one group. This enables to suppress the extension of the second semiconductor regions in one group, to produce a device excellent in the resistance to punch through. In the other group, the insulating film remains to receive less contamination, resulting in an element having high junction characteristics. That is, this method is suited for manufacturing a device comprising an element which gives precedence to the prevention of junction characteristics degradation over the improvement of the resistance to punch through, and a different type element.

In the method of the seventeenth aspect, after the thickened part of the insulating film is selectively thinned in both first and second groups, the thinned part is selectively removed in either group, thereafter, an impurity implantation for forming the second semiconductor regions is performed. It is therefore possible to improve the resistance to punch through in both groups while retaining high junction characteristics in one group that gives precedence to the prevention of junction characteristics degradation.

In the method of the eighteenth aspect, an impurity implantation for forming the second semiconductor regions is performed after the major surface of the semiconductor substrate in which the second semiconductor regions will be formed, is projected by depositing a semiconductor layer in at least one group. Therefore, the second semiconductor regions can be made shallow, resulting in a device having an element excellent in the resistance to punch through. This method makes it easy to obtain the device of the sixth aspect.

In the method of the nineteenth aspect, in at least one group a semiconductor metal compound layer is formed on the major surface of the semiconductor substrate corresponding to the second semiconductor regions. Through the compound layer, major electrodes are connected to the second semiconductor regions, resulting in a device provided with MOS transistor having a high current driving capability. This method therefore makes it easy to obtain the device of the seventh aspect. In particular, when this method is combined with that of the seventeenth aspect, and second semiconductor regions are formed before the semiconductor layer is deposited, it is possible to suppress a spike that may occur during forming the compound layer from degrading the junction characteristics between the first and second semiconductor regions.

In the method of the twentieth aspect, since a material having a high resistance to thermal reaction than the semiconductor substrate is employed as a conductive material, the bird's beaks can be formed by thermal reaction treatment, without taking into consideration a reduction in the conductive material thickness. This leads to a further simplified method.

It is an object of the present invention to obtain a semiconductor device that can realize long lifetime and high-speed operation without need for a difficult manufacturing step.

It is another object of the present invention to provide a method suited for manufacturing the above semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

[Device Construction and Operation]

Figure 1:
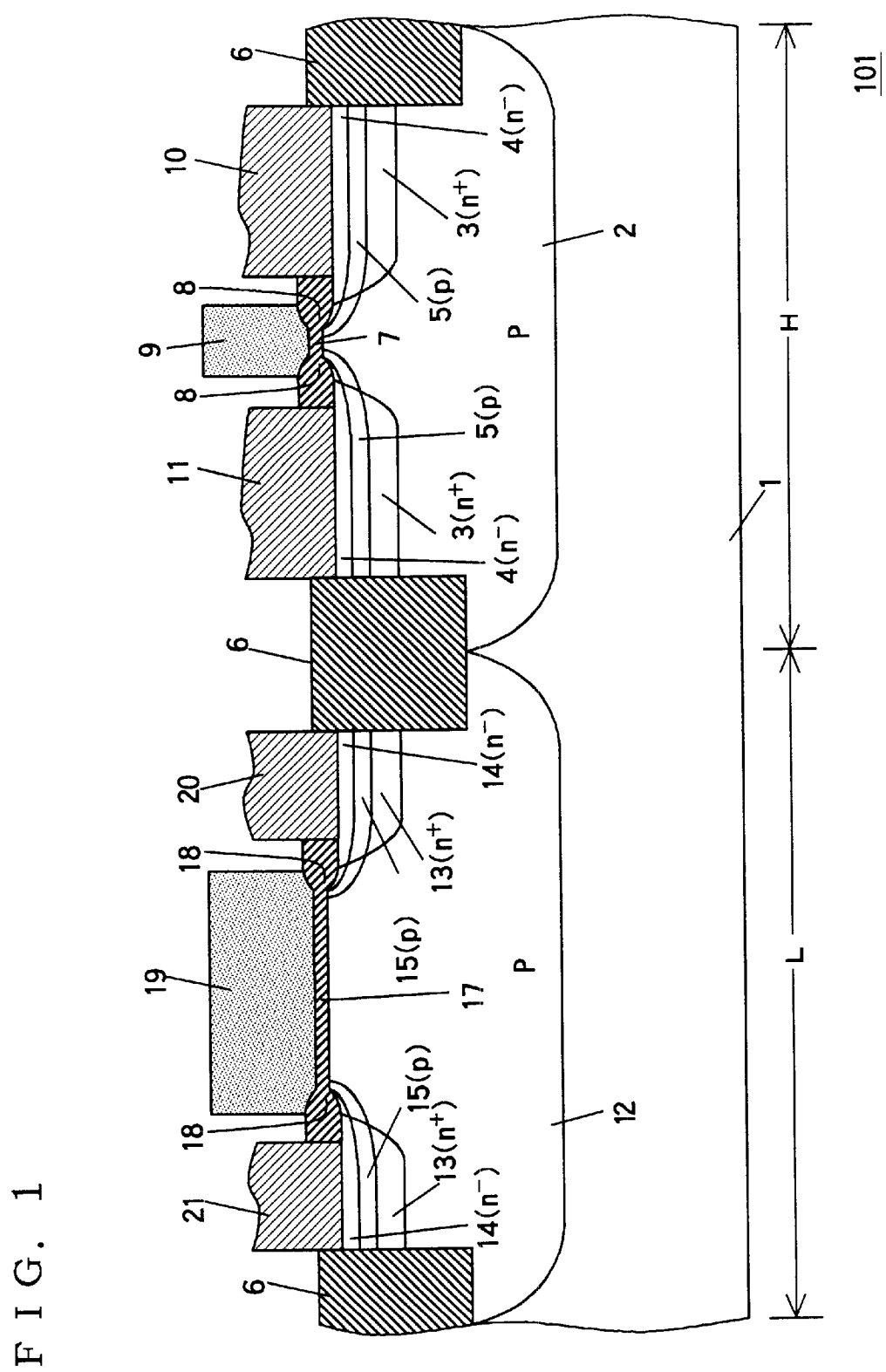
FIG. 1 is a cross-sectional view of a semiconductor device according to a first preferred embodiment of the present invention.

FIG. 1 is a cross-sectional view of a semiconductor device according to a first preferred embodiment. In a semiconductor device 101, a high-voltage element H to which a high gate voltage is applied, and a low-voltage element L to which a gate voltage lower than that to the element H, are formed in a single semiconductor substrate 1. Hereinafter the semiconductor substrate 1 is a silicon substrate as a typical representative. The elements H and L are both MOS transistors and are electrically isolated from other elements adjoining them, by an element isolator 6 that comprises a silicon oxide formed on the upper major surface of the substrate 1.

In the upper major surface of the substrate 1, P type wells 2 and 12 extend over the entire regions in which the elements H and L are formed, respectively, so as to surround the element isolator 6. N type source/drain region 3 is selectively formed around the central portion on the exposed surface of the P type well 2. Similarly, N type source/drain region 13 is selectively formed around the central portion on the exposed surface of the P type well 12. The source/drain regions 3 and 13 are shallower than the wells 2 and 12, respectively.

A gate insulating film 7 is formed on the central portion of the exposed surface of the well 2 that belongs to the high-voltage element H, i.e., on the exposed surface of the well 2 surrounded by the two source/drain regions 3. A gate electrode 9 overlies the gate insulating film 7. That is, the gate electrode 9 is opposed, through the gate insulating film 7, to the exposed surface of the well 2 surrounded by the two source/drain regions 3. A source electrode 10 and a drain electrode 11 are connected to the exposed surfaces of the two source/drain regions 3, respectively.

Specifically, the elements H and L are both constructed as N channel type MOS transistor. By adjusting the voltage (gate voltage) applied to the gate electrodes 9, 19, with the voltage (drain voltage) applied between the source electrodes (major electrodes) 10, 20 and the drain electrodes (major electrodes) 11, 21, it is possible to control the magnitude of the major current (drain current) that flows across the source electrodes 10, 20 and across the drain electrodes 11, 21, respectively. The regions of the exposed surfaces of the wells 2 and 12 which are respectively surrounded by the source/drain regions 3, 13, and are opposed to the gate electrodes 9 and 19, function as the channel regions of the elements H and L, respectively.

The part of the gate insulating film 7 which is located directly beneath the gate electrode 9, comprises a relatively thin central portion and a thick peripheral portion. The thick peripheral portion is, as described later, formed by conducting a thermal oxidation treatment (generally, heat reaction treatment) after the gate electrode 9 is formed on the gate insulating film 7. As a result, the region directly beneath the gate electrode 9 projects from the edge to the central portion in the shape of a bird's beak, which is therefore called "bird's beak."

Also, in the exposed surface of the well 2, N type extension region 4 and P type pocket region 5 are selectively formed around the central portion. The extension region 4 is shallower than the source/drain region 3 and formed so as to extend from the edge of the region 3 to the central portion. The extension region 4 is preferably be formed so as to cover the entire bottom of a bird's beak 8.

The pocket region 5 is deeper than the extension region 4, shallower than the source/drain region 3, and formed so as to surround the entire extension region 4. That is, the extension region 4 does not project beyond the pocket region 5. The impurity concentrations of the extension region 4 and the pocket region 5 are set lower than that of the source/drain region 3.

The conductivity types of the portions of the extension region 4 and the pocket region 5 which overlap with the source/drain region 3, are N type and substantially the components of the source/drain region 3. The impurity concentration of the pocket region 5 is higher than those of the wells 2, 12 and is lower than that of the extension region 4. The conductivity type of the region in which the pocket region 5 overlaps with the extension region 4 is N type.

Like the high-voltage element H, the low-voltage element L comprises a source/drain region 13, an extension region 14, a pocket region 15, a gate insulating film 17, a gate electrode 19, a source electrode 20, and a drain electrode 21. A bird's beak 18 is formed on both ends of the gate insulating film 17.

The depths in which the bird's beaks 8 and 18 intrude from the edges of the gate electrodes 9 and 19 to the regions directly beneath them (i.e., the length from the edges of the gate electrodes 9, 19, in FIG. 1, hereinafter referred to as "depth of intrusion") are approximately equal between the elements H and L. Preferably, both of the gate insulating film 7 of the element H and the gate insulating film 17 of the element L are composed of silicon oxide, the gate electrodes 9, 19 are composed of an impurity-doped polysilicon, and the major electrodes 10, 11, 20, 21 are composed of a metal or compound whose base material is aluminum.

When compared the lengths of the gate electrodes 9 and 19 in the direction from the source electrode to the drain electrode between the elements H and L (hereinafter referred to as "gate length"), the gate length of the gate electrode 9 is large and that of the gate electrode 19 is small. Therefore, the thin portions of the gate insulating films 7 and 17 surrounded by the bird's beaks 8 and 18, respectively, is long in the low-voltage element L and short in the high-voltage element H. Preferably, it is set so that the thin portion of the gate insulating film 17 substantially occupies almost all region directly beneath the gate electrode 19, and that of the gate insulating film 7 does not exceed 80% of the region directly beneath the gate electrode 9. For instance, the thin portions of the gate insulating films 7, 17 have a thickness in the range of about 2 to 6 nm, the gate length of the gate electrode 9 is in the range of about 0.05 to 0.25 μm, and the gate length of the gate electrode 19 is in the range of about 0.1 to 0.5 μm. The depth of intrusion of the bird' beaks 8, 18 is in the range of 0.02 to 0.1 μm.

Accordingly, in the high-voltage element H, the part of the gate insulating film 7 which is located directly beneath the gate electrode 9 is thick over a considerable region including both edge portions of the film 7. In the low-voltage element L, much of the region of the gate insulating film 17 directly beneath the gate electrode 19 is thin. Therefore, the aged deterioration of the gate insulating film 7 in the high-voltage element H can be effectively suppressed even if a high gate electrode is applied to the gate electrode 9.

In the low-voltage element L in which a low gate voltage is applied to the gate electrode 19 and the aged deterioration is not of particular concern, since the great majority of the gate insulating film 17 is thin, the element L can exhibit a high current driving capability and thus effective in responding to high-speed operation requests. In the gate insulating film 7 that is required to withstand to high gate voltages, the central portion, i.e., portion except for a peripheral portion, of the region directly beneath the gate electrode 9 is thin as in the great majority of the gate insulating film 17, however, the peripheral portion is more liable to deteriorate than the central portion. Therefore, even when the thin part remains in the central portion, it is able to ensure a considerable effect of suppressing the aged deterioration.

In addition, unlike the semiconductor device 152, the semiconductor device 101 can be manufactured through relatively simple steps as described later, without need for complex steps including selectively forming a shield 95 (see FIG. 4). That is, the device 101 has the advantage over the conventional devices 151, 152 in that it realizes both long lifetime and high-speed operation, without need for difficult manufacturing steps.

Still further, since the portions directly beneath the bird's beaks 8 and 18 are covered by the extension regions 4 and 14 that are the extended portions of the source/drain regions 3 and 13, respectively, the bird's beaks 8 and 18 can function to prevent the gate threshold voltage from increasing. Additionally, the pocket regions 5 and 15 suppress punch through. Also, the extension regions 4 and 14 contribute to the suppression of punch through because they function as a shallow source/drain region.

[Manufacturing Method]

Figure 42:
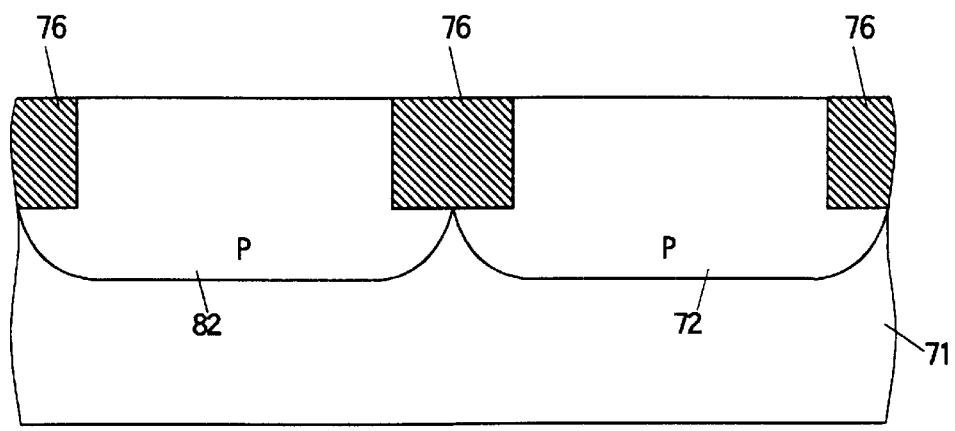
FIG. 42 to 47 are cross-sectional views showing a sequence of steps in a method for manufacturing the device of FIG. 41.
Figure 43:
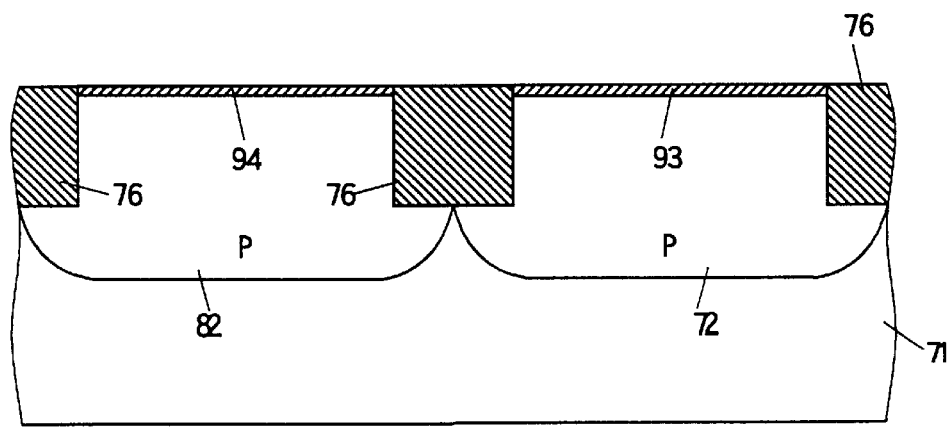

FIGS. 2 to 8 show a sequence of steps in a preferred method for manufacturing a semiconductor device 101. To obtain the device 101, the same steps as in FIGS. 42 and 43 are firstly conducted.

Figure 2:
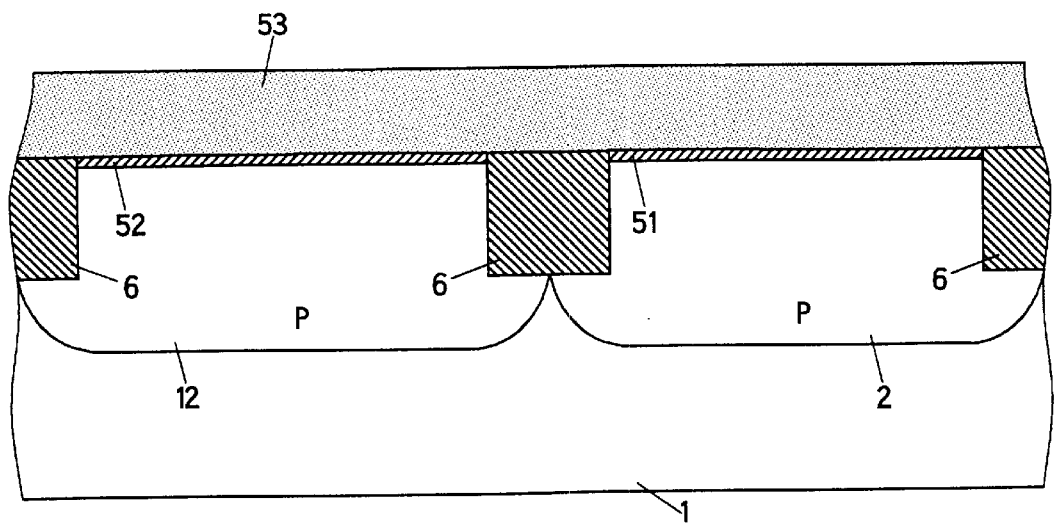
FIGS. 2 to 11 are cross-sectional views showing a sequence of steps in a method for manufacturing the device of FIG. 1.

Referring to FIG. 2, an element isolator 6 and wells 2, 12 are selectively formed on a semiconductor substrate 1. Insulating films 51, 52 are formed on the exposed surfaces of the well 2, 12. The insulating films 51, 52 are preferably composed of a silicon oxide film. Thereafter, a conductive material 53 that is the material of a gate electrode is deposited in layer form over the entire surfaces of the insulating films 51, 52. The conductive material 53 is preferably composed of a polysilicon in which impurities are doped in high concentrations.

Figure 3:
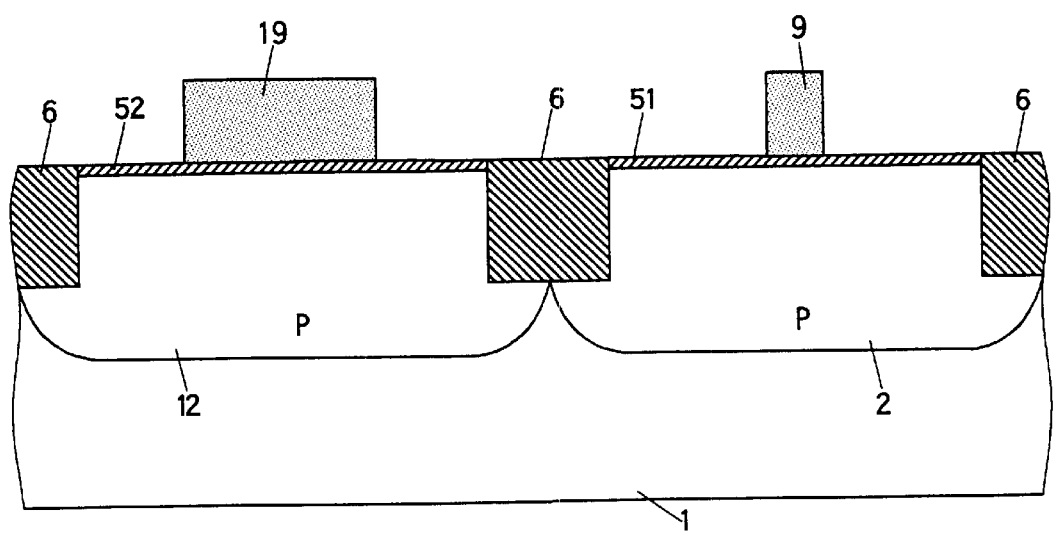

Referring to FIG. 3, the conductive material 53 is selectively removed by using a selective etching, so that gate electrodes 9 and 19 are provided on the insulating films 51 and 52 that belong to the regions whereat it is desired to dispose element H and L, respectively. The gate electrodes 9 and 19 are provided in their respective central portions of the insulating films 51 and 52, and the gate length is set to be small for the gate electrode 9 and large for the gate electrode 19.

Figure 4:
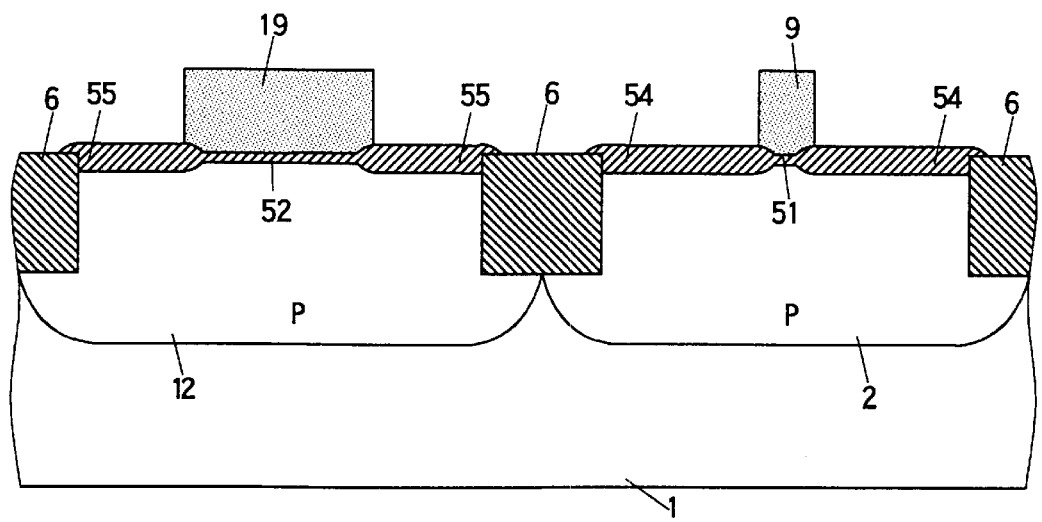

Referring to FIG. 4, the exposed surfaces of the insulating films 51 and 52 are subjected to thermal oxidation treatment to thicken their exposed surfaces. Here, the oxidation reaction proceeds not only in the exposed surfaces but also proceeds somewhat in the regions shielded by the gate electrodes 9 and 19. As a result, insulating films 54 and 55 that are thicker than the original insulating films 51 and 52, respectively, are selectively formed in the exposed surfaces of the original insulating films 51, 52, and in the portion extending somewhat to the region directly beneath the gate electrodes 9, 19. The portions of the insulating films 54 and 55 extending to the region directly beneath the gate electrodes 9 and 19, correspond to "bird's beak" as stated above.

Figure 5:
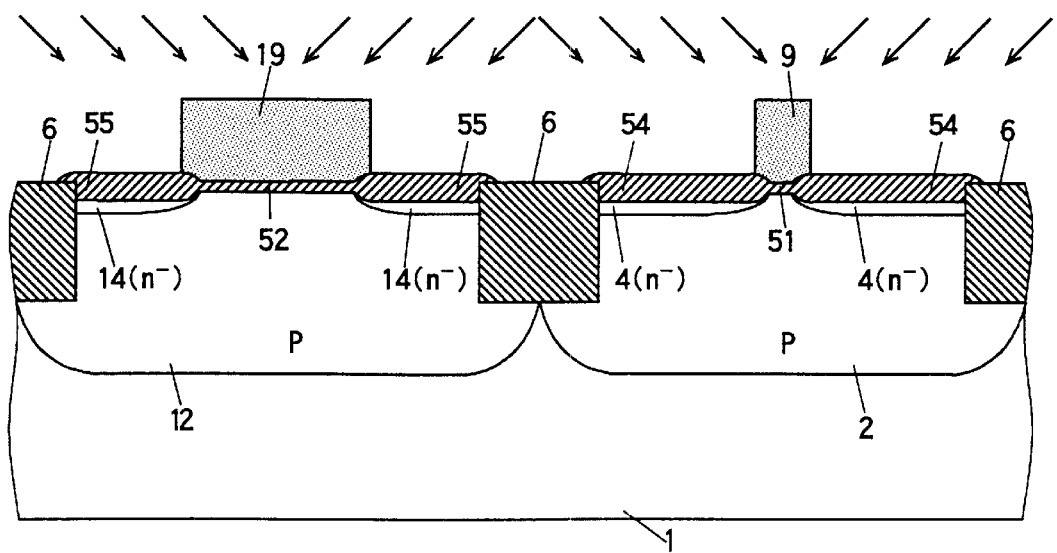

Referring to FIG. 5, with the gate electrodes 9, 19 acting as a shied, N type impurity, such as phosphor or arsenic, is selectively implanted into the upper major surfaces of the wells 2, 12, to form extension regions 4, 14. Here, it is desirable to employ an oblique implantation in order that the extension regions 4 and 14 cover the portions directly beneath the regions that correspond to the bird's beaks of the insulating films 54 and 55, respectively.

Figure 6:
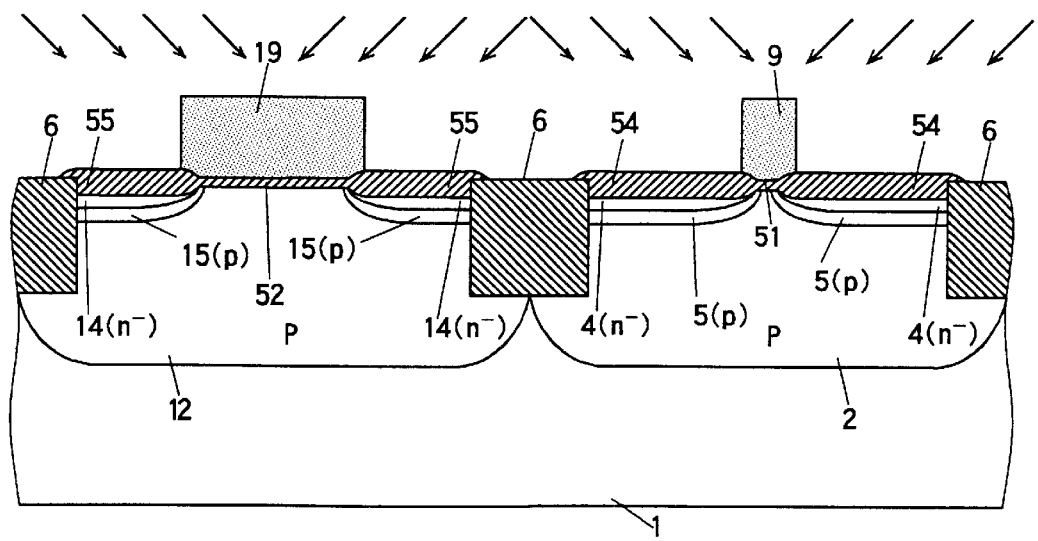

Referring to FIG. 6, with the gate electrodes 9, 19 acting as a shield, P type impurity, such as boron, is selectively implanted into the upper major surfaces of the wells 2, 12, to form pocket regions 5, 15. Here, it is desirable to employ an oblique implantation in order that the pocket regions 5 and 15 include the extension regions 4 and 14, respectively.

The P type impurity implantation, preferably using boron, is conducted at the energy in the range of from 5 keV to 20 keV and the dosage of from $1 \times 10^{13}$ cm$^{-2}$ to $20 \times 10^{13}$ cm$^{-2}$. When the elements H, L are of P type MOS transistor, N type impurity, preferably arsenic or phosphor, is implanted for forming pocket regions 5, 15 at the energy in the range of from 50 keV to 100 keV and the dosage of from $1 \times 10^{13}$ cm$^{-2}$ to $20 \times 10^{13}$ cm$^{-2}$.

Figure 7:
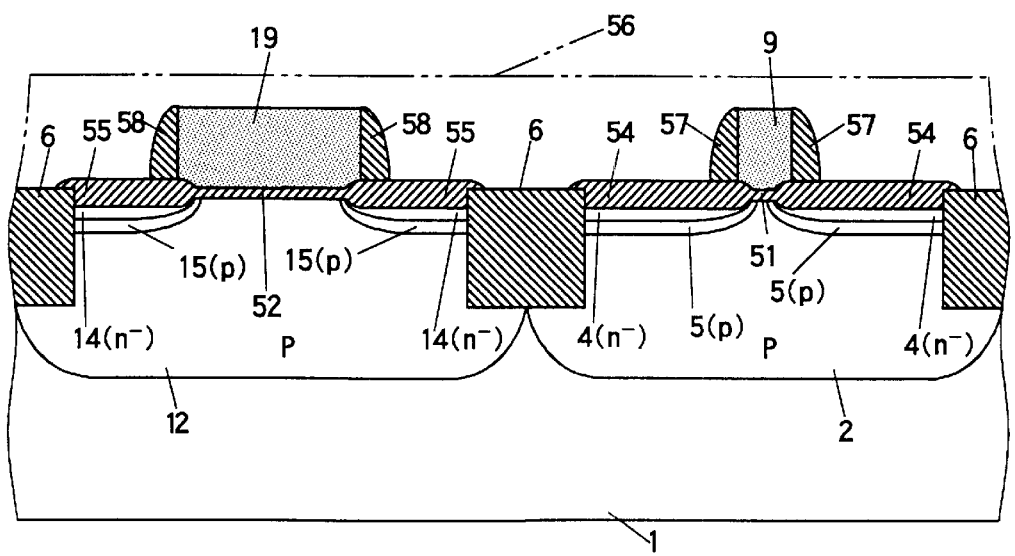

Referring to FIG. 7, a shield material 56 composed of oxide or nitride is deposited over the entire surface of the intermediate product obtained after the manufacturing step in FIG. 6 is completed. For instance, CVD method is employed for depositing the shield material 56. Then, an anisotropic etching is performed for the entire surface of the shield material 56, so that side walls 57 and 58 are formed on the side faces of the gate electrodes 9 and 19, respectively.

Figure 8:
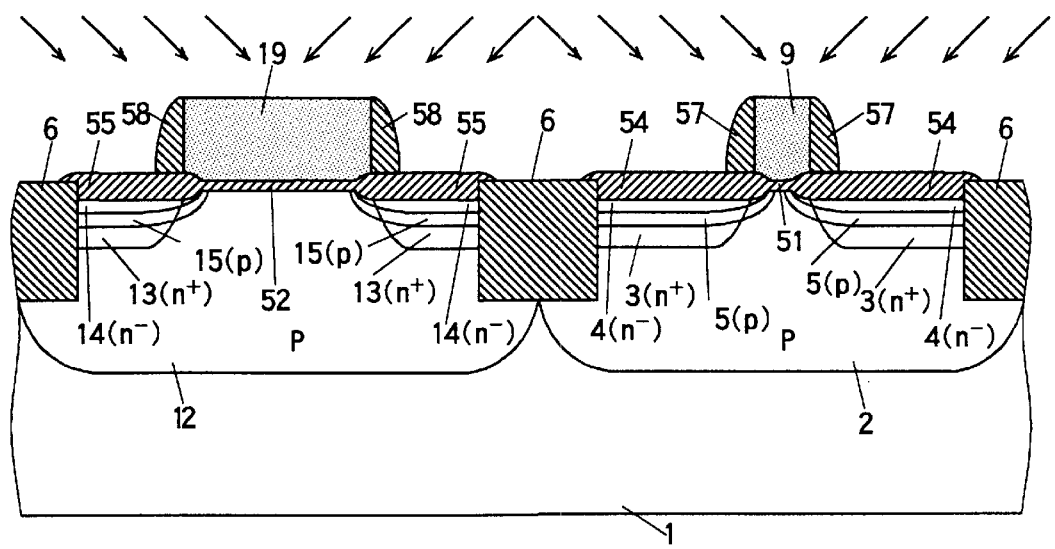

Referring to FIG. 8, with the gate electrodes 9, 19 and the side walls 57, 58 acting as a shield, N type impurity is implanted in a high concentration, so that source/drain regions 3, 13 are selectively formed on the upper surfaces of the wells 2, 12. The side walls 57, 58 are then removed. It is obvious that a diffusion step is performed after the impurity implantation, and therefore, its description is omitted here and throughout the specification.

Thereafter, an opening is selectively formed in the insulating films 54, 55. Source electrodes 10, 20 and drain electrodes 11, 21 are connected, through the opening, to the upper surfaces of the source/drain regions 3, 13. This results in the semiconductor device 101 shown in FIG. 1. It is noted that the impurity implantations for forming the extension regions 4, 14, the pocket regions 5, 15, and the source/drain regions 3, 13 can be conducted either before or after forming the thick insulating films 54, 55.

Figure 9:
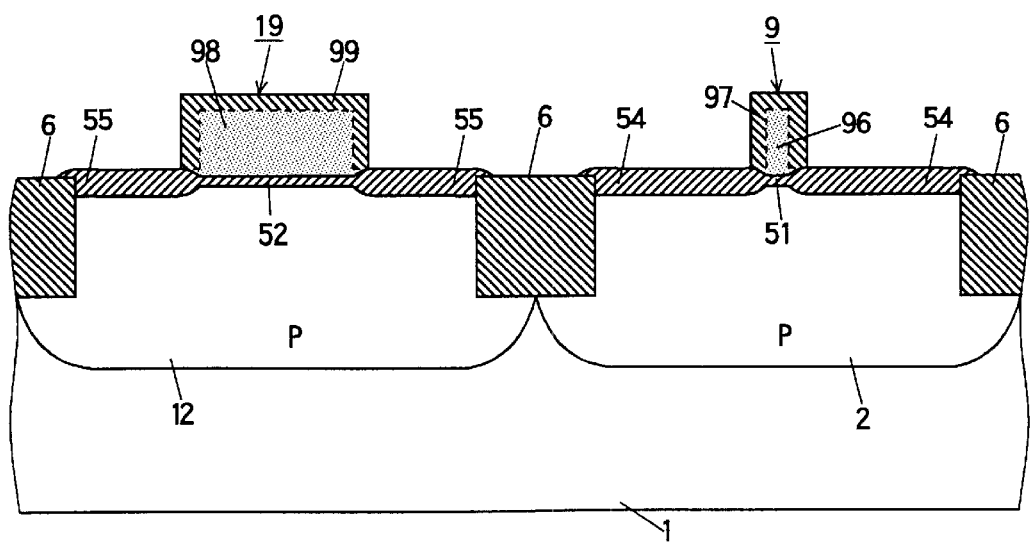

When in the manufacturing step shown in FIG. 2, polysilicon is deposited as a material 53, the gate electrodes 9, 19 obtained after the thermal oxidation treatment shown in FIG. 4 has the internal structure as shown in FIG. 9. That is, the oxidation reaction also proceeds in the surface of the material 53, i.e., the sides and upper surface, as the thermal oxidation treatment proceeds. As a result, polysilicon layers 96 and 98 free from oxidation remain within the gate electrodes 9 and 19, respectively, and silicon oxide layers 97 and 99 are formed on the surfaces of the electrodes 9 and 19, respectively.

That is, during the thermal oxidation treatment, the polysilicon layers 96 and 98 that function as a conductor in the gate electrodes 9 and 19, respectively, is thinned. This may cause an increase in the electric resistance of the gate electrodes 9, 19. Thereby, in particular, the gate electrode 9 is seriously affected because its gate length is relatively small.

In the manufacturing steps shown in FIGS. 2 to 4, therefore, each step is performed in consideration that the polysilicon layers 96, 98 may be thinned. For example, polysilicon serving as a material 53 may be deposited relatively thicker in the step of FIG. 2; the gate lengths of the gate electrodes 9, 19 may be set to be relatively longer in the step of FIG. 3; and the temperature and time of treatment may be adjusted in order to prevent the polysilicon layers 96, 98 (particularly, the polysilicon layer 96) from being excessively thinned in the thermal oxidation treatment of FIG. 4.

If the thicknesses of the silicon oxide layers 97, 99 is controlled to be small, the depth of intrusion of a bird's beak becomes small accordingly. Since the thicknesses of the silicon oxide layers 97, 99 are approximately equal to the depth of intrusion of the bird's beak, it is possible to ensure the necessary thickness of the polysilicon layer 96 while setting up a bird's beak for having a sufficient thickness, in the gate electrode 9 whose gate length is short. The silicon oxide layers 97, 99 may be removed together with the side walls 57, 58 when the side walls 57, 58 are removed after performing the step of FIG. 8.

Figure 10:
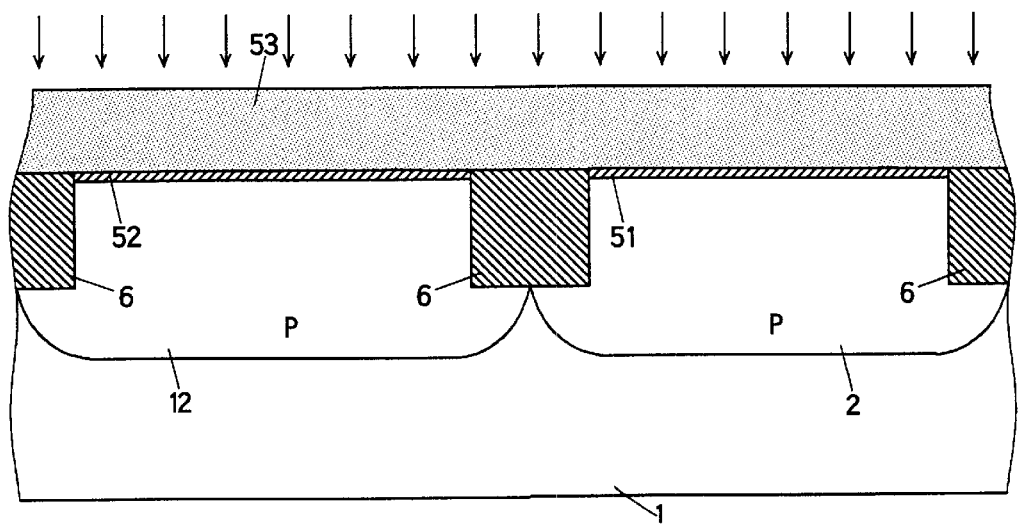

More preferably, the gate electrodes 9, 19 may be composed of a material which is more resistant to oxidation than the semiconductor substrate 1, i.e., a material having a higher resistance to thermal oxidation reaction than the substrate 1. For example, in the step of FIG. 2, there may be deposited a nitrogen-doped polysilicon layer, as a material 53. Alternatively, after a polysilicon layer is stacked as a material 53, nitrogen may be implanted into the entire surface of the material 53, as shown in FIG. 10, so that the material 53 converts to a nitrogen-doped polysilicon layer.

Figure 11:
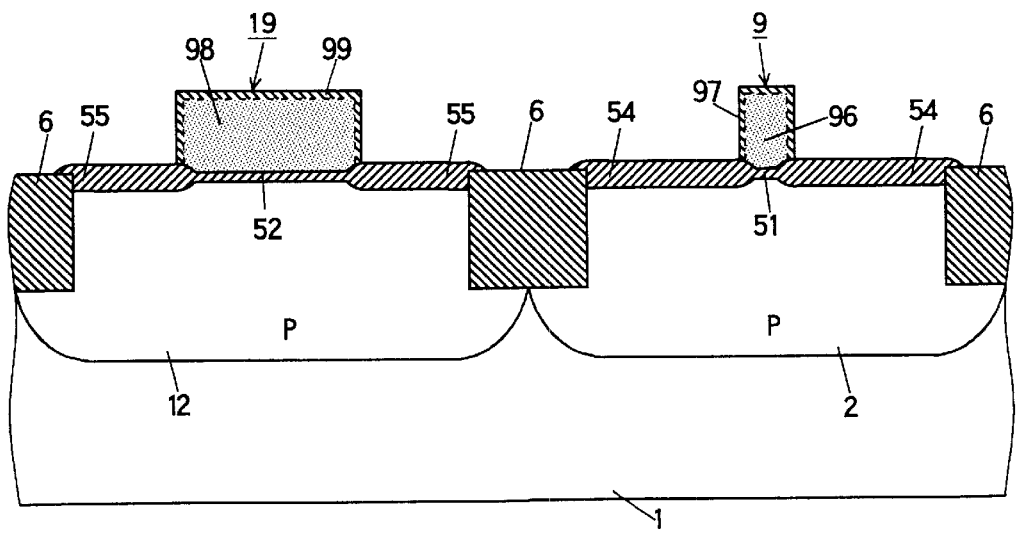

The material 53 is resistant to thermal oxidation in the subsequent thermal oxidation treatment of FIG. 4. Therefore, when the thermal oxidation treatment is completed, the thicknesses of the silicon oxide layers 97, 99 are smaller than the depth of intrusion of the bird's beak, as shown in FIG. 11. That is, the gate electrodes 9, 19 are substantially composed of the polysilicon layers 96, 98.

Alternatively, in the step of FIG. 2 a metal layer, a metal silicide (a compound of metal and silicon) layer, or a metal nitride layer may be deposited as a material 53, instead of the polysilicon layer. Since such materials have a higher resistance to thermal oxidation reaction than the substrate 1, an oxide film to be formed in the thermal oxidation treatment of FIG. 4 can be controlled to be thin.

Alternatively, in the step of FIG. 2 a multi-layer structure comprising a polysilicon layer and a metal suicide layer formed thereon may be deposited as a material 53. In the thermal oxidation treatment of FIG. 4, silicon oxide layers 97, 99 are formed on the side surfaces of the gate electrodes 9, 19 as in the step shown in FIG. 9, whereas the formation of silicon oxide layers 97, 99 is suppressed on the upper surfaces of the electrodes 9, 19. Accordingly, a reduction in the thickness of the polysilicon layers 96, 98 is alleviated. Various treatments in consideration of the oxidation of the gate electrodes 9, 19 are also applicable to the following preferred embodiments.

Figure 44:
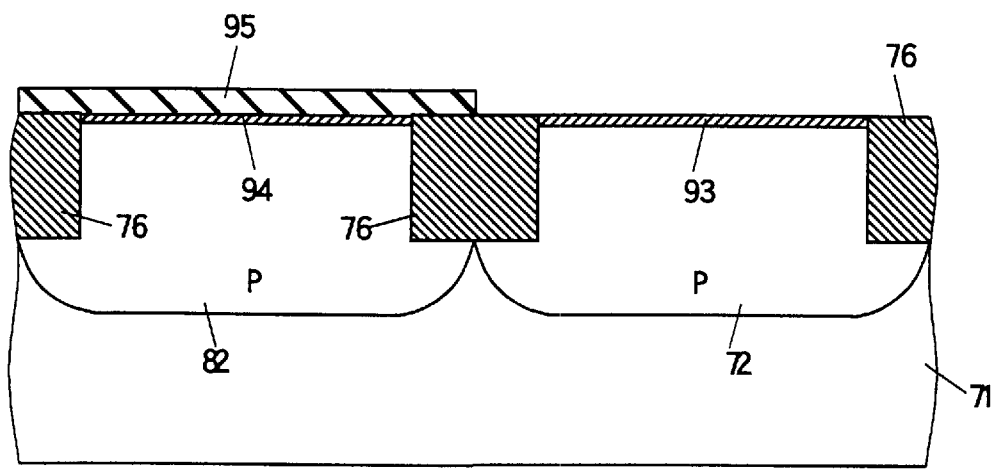
Figure 45:
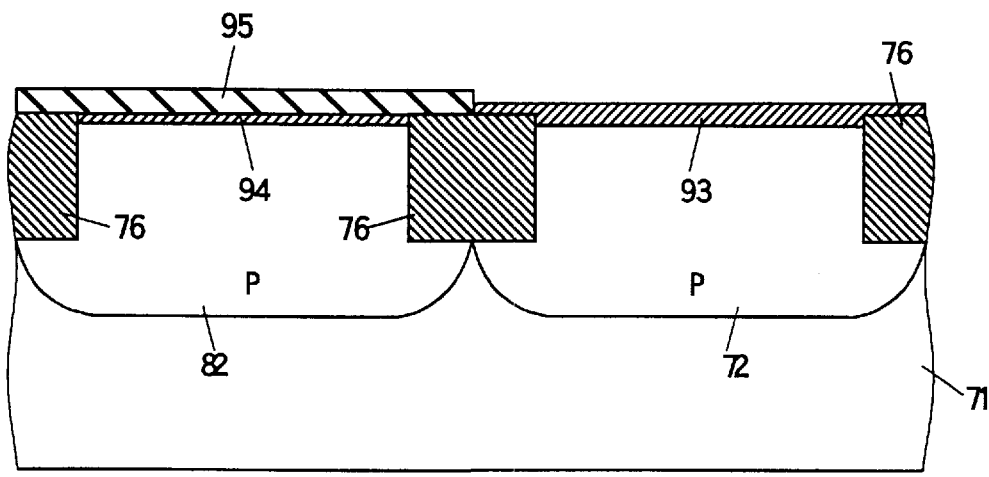
Figure 46:
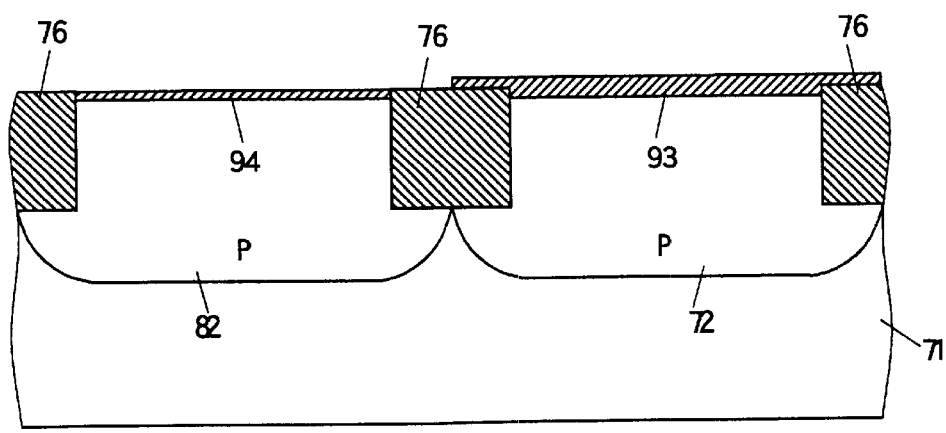
Figure 47:
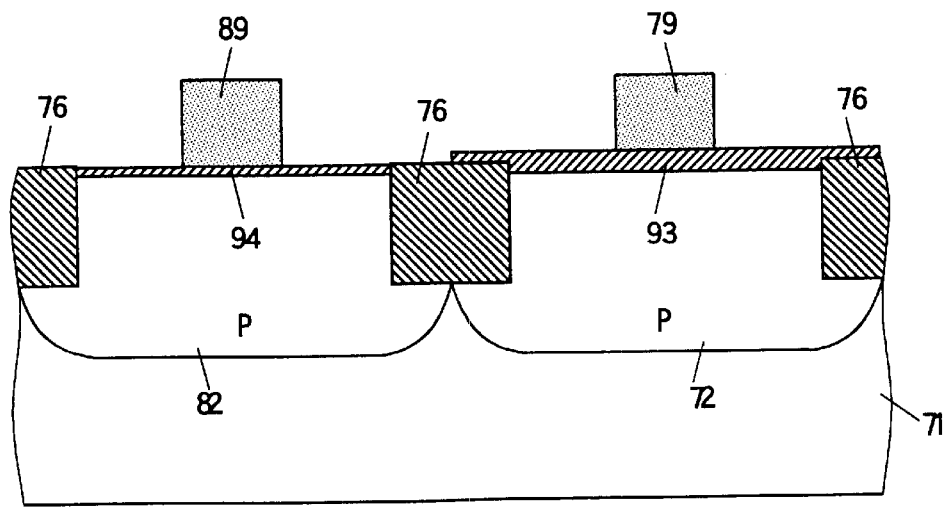

Thus, unlike the conventional semiconductor device 152, the device 101 is obtained without the step of forming the shield 95 (see FIG. 44) and the step of thickening the insulating film 93 by using the shield 95 (see FIG. 45). This permits an easy manufacture of the device 101 through relatively simple steps.

Second Preferred Embodiment

Figure 12:
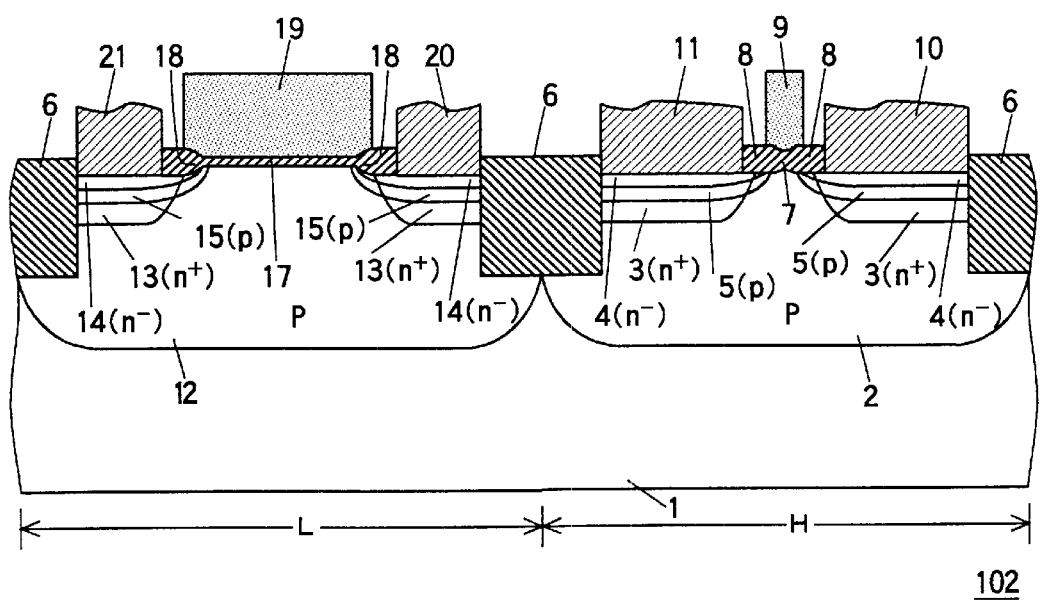
FIG. 12 is a cross-sectional view of a semiconductor device according to a second preferred embodiment of the present invention.

FIG. 12 is a cross-sectional view of a semiconductor device according to a second preferred embodiment. A semiconductor device 102 is characteristically different from the device 101 (see FIG. 1) in that no thin portions exist in the central portion of a gate insulating film 7 that belongs to a high-voltage element H, and a bird's beak 8 occupies the entire region of the gate insulating film 7 which is located directly beneath a gate electrode 9. Thus, in the region of the gate insulating film 7 which is located directly beneath the gate electrode 9, bird's beak 8 occupies 100% and thin portion is 0%. Whereas in a gate insulating film 17 that belongs to a low-voltage element L, thin portions occupy much of the region directly beneath a gate electrode 19, as in the device 101.

This characteristic construction is obtained by adjusting the gate lengths of the gate electrodes 9, 19 and the depth of intrusion of the bird's beaks 8, 18, so that the depth of invasion of the bird's beaks 8, 18 are more than half of the gate length of the gate electrode 9 and they are also sufficiently smaller than the gate length of the gate electrode 19.

The part of the gate insulating film 7 which is located directly beneath the gate electrode 9 that belongs to the high-voltage element H, is entirely thickened as described. Therefore, the aged deterioration of the gate insulating film 7 is suppressed further effectively. In the low-voltage element L, much of the region of the gate insulating film 17 which is located directly beneath the gate electrode 19 is thin as in the device 101, to exhibit a high current driving capability, permitting an effective response to high-speed operation requests.

In addition, the device 102 can be obtained through relatively simple steps (described later) without need for a complex step, as in the device 151. That is, like the device 101, the device 102 realizes long lifetime and high operation speed without need for any difficult manufacturing steps, and is particularly excellent in exhibiting long lifetime by suppressing the aged deterioration.

Figure 13:
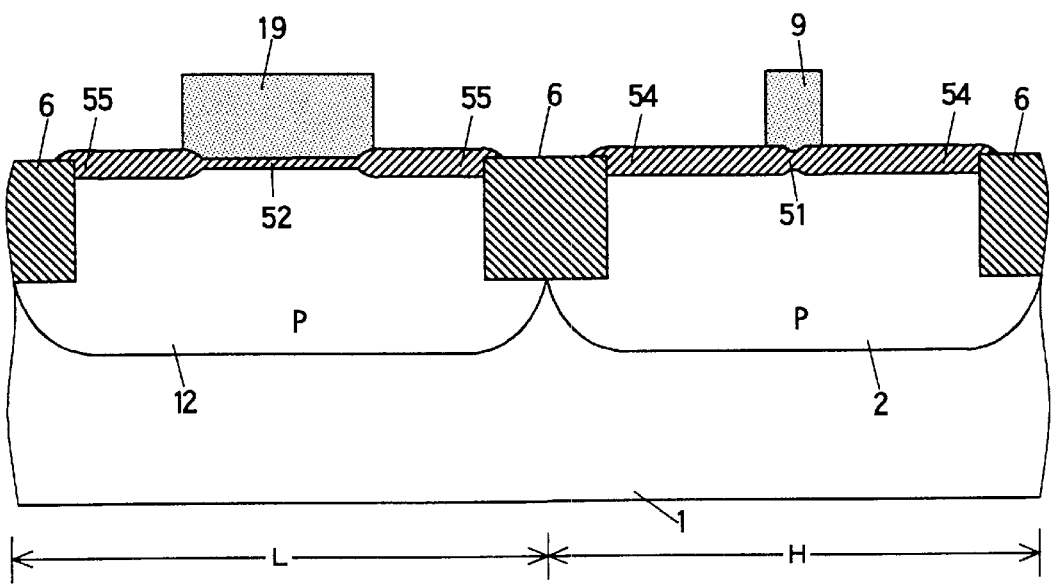
FIG. 13 is a cross-sectional view of a manufacturing step of the device of FIG. 12.

The device 102 is obtained by replacing the step of FIG. 4 in the first preferred embodiment with the step of FIG. 13, in which thermal oxidation treatment is conducted for the exposed surfaces of the insulating films 51, 52. As a result, the exposed surfaces of the insulating films 51, 52 become thick. At the same time, the thick portions also intrude into the regions shielded by the gate electrode 9, 19, as a bird's beak.

The conditions, such as the temperature and time of the thermal oxidation treatment and the gate lengths of the gate electrodes 9, 19 in the step of FIG. 3 prior to that of FIG. 4, are set so that the bird's beaks which intrude from both sides of the gate electrode 9 to the area directly beneath the electrode 9 are connected to each other, and the ratio of the thick portions due to the intrusion toward the region directly beneath the gate electrode 19, as a bird's beak, is negligibly small to the entire region directly beneath the gate electrode 19.

In the second preferred embodiment the bird's beaks are connected to each other directly beneath the gate electrode 9 and thus effective in the treatment for suppressing the oxidation of the gate electrode 9, as set forth in the first preferred embodiment.

As stated above, the device 102 is readily manufactured through relatively simple steps as in the device 101.

Third Preferred Embodiment

Figure 14:
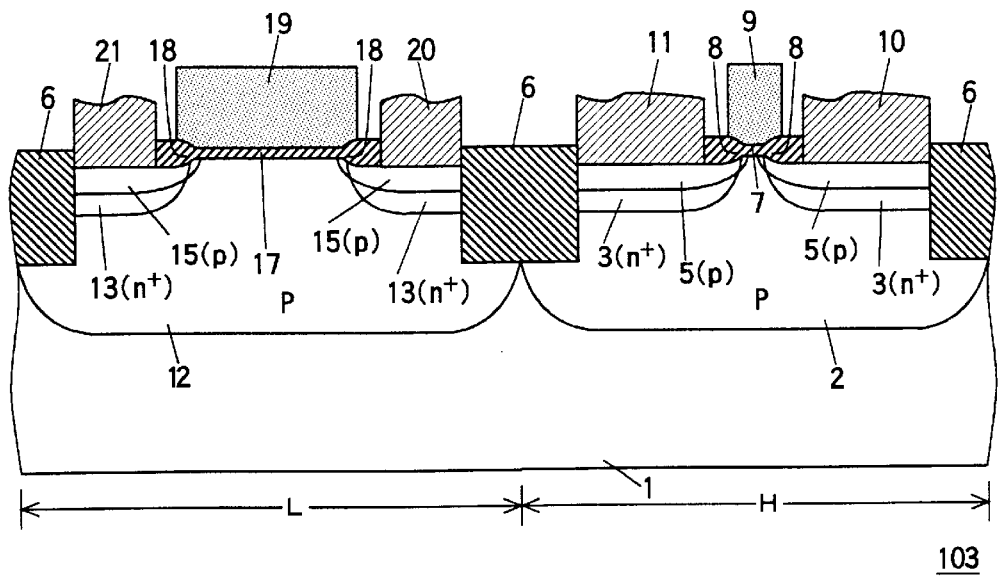
FIG. 14 is a cross-sectional view of a semiconductor device according to a third preferred embodiment of the present invention.

FIG. 14 is a cross-sectional view of a semiconductor device according to a third preferred embodiment. A semiconductor device 103 is characteristically different from the device 101 in that source/drain regions 3, 13 extend to the central portion of gate insulating films 7, 17 so as to cover the regions directly beneath bird's beaks 8, 18.

Since the gate electrodes 9, 19 are opposed to the entire channel region only through the thin portions of the gate insulating films 7, 17, it is possible to prevent the bird's beaks 8, 18 from increasing the threshold voltage than necessary, even in the absence of extension region 4, 14. In addition, since the effective channel length becomes small, it is possible to attain a further high current driving capability while suppressing the short channel effect.

Referring to FIG. 14, pocket regions 5, 15 can be so formed that they are shallower than the source/drain region 3 and project beyond the source/drain regions 3, 13 in the direction of the central portions of the gate insulating films 7, 17. This permits the effective suppression of punch through. That is, the device 103 with a simpler construction produces the same effect as the device 101.

Figure 15:
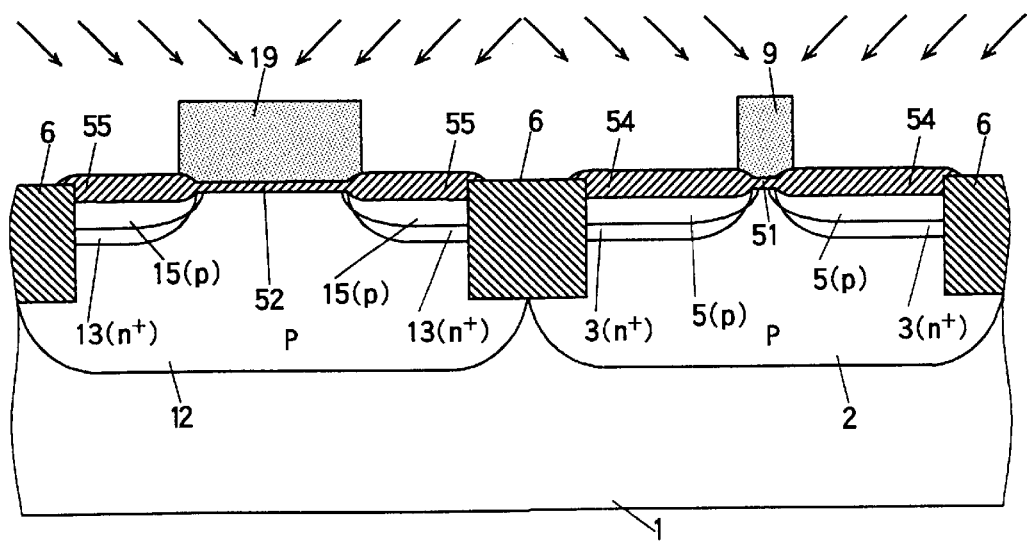
FIG. 15 is a cross-sectional view of a manufacturing step of the device of FIG. 14.

In manufacturing a device 103, firstly the same manufacturing steps up to that of FIG. 4 are conducted according to the method of the first preferred embodiment, the step of FIG. 5 is omitted, the step of FIG. 6 is performed, and the step of FIG. 15 is conducted instead of the steps of FIGS. 7 and 8.

Referring to FIG. 15, without using side walls 57, 58, N type impurity is selectively implanted with the gate electrodes 9, 19 acting as a shield, to form source/drain regions 3, 13. Here, it is desirable to employ an oblique implantation. As a result, through a diffusion step that is always conducted after the implantation, source/drain regions 3, 13 are formed so as to cover the bottom surfaces of the thick insulating films 54, 55.

N type impurity implantation for forming source/drain regions 3, 13, preferably using phosphorus or arsenic, is conducted at the energy in the range of from 50 keV to 100 keV and the dosage of from $2 \times 10^{15}$ cm$^{-2}$ to $8 \times 10^{15}$ cm$^{-2}$. When the elements H, L are of P type MOS transistor, P type impurity, preferably boron or BF$_2$, is implanted at the energy in the range of from 20 keV to 60 keV and the dosage of from $2 \times 10^{15}$ cm$^{-2}$ to $8 \times 10^{15}$ cm$^{-2}$.

Thereafter, as in the method of the first preferred embodiment, source electrodes 10, 2(0 and drain electrodes 11, 21 are formed, resulting in the device 103. The respective impurity implantations for forming the extension regions 4, 14, pocket regions 5, 15, and source/drain regions 3, 13 can be performed either before or after forming the thick insulating films 54, 55.

As stated above, the device 103 is readily obtained through simpler steps than those of the device 101.

Fourth Preferred Embodiment

Figure 16:
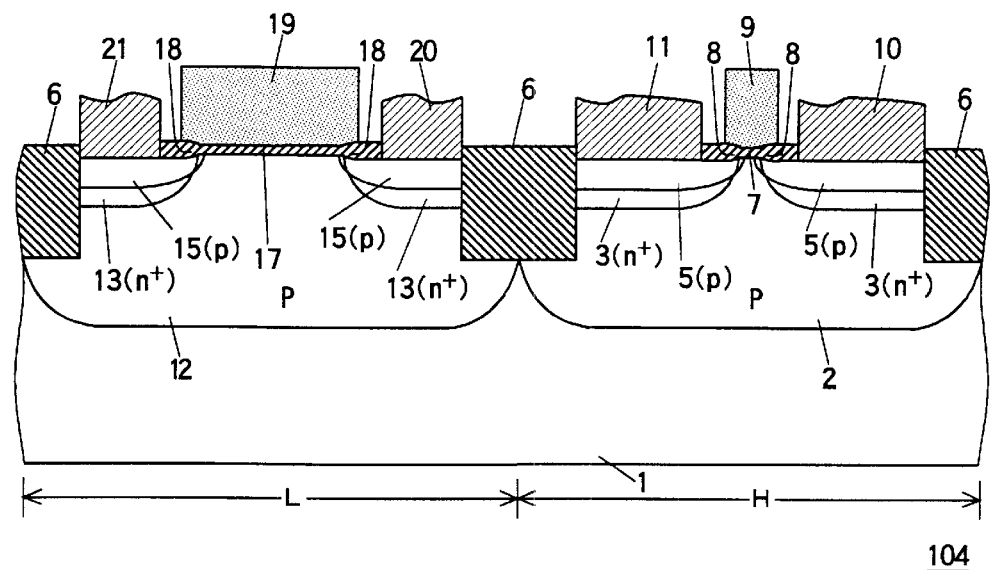
FIG. 16 is a cross-sectional view of a semiconductor device according to a fourth preferred embodiment of the present invention.

FIG. 16 is a cross-sectional view of a semiconductor device according to a fourth preferred embodiment. A semiconductor device 104 is characteristically different from the device 101 in having a small depth in which bird's beaks 8, 18 erode downwardly a semiconductor substrate 1, i.e., the depth of sink of the substrate 1 (hereinafter referred to as "depth of sink").

Specifically, the thicknesses of the bird's beaks 8, 18 in the device 101 is about 100 nm, half of which, i.e., 50 nm, is the depth of sink. As the depth of sink increases, it is liable to cause punch through, which is unfavorable. On the other hand, in the device 104 the depth of sink of the bird's beaks 8, 18 is smaller than 50 nm, so that the device 104 is resistant to punch through.

Figure 17:
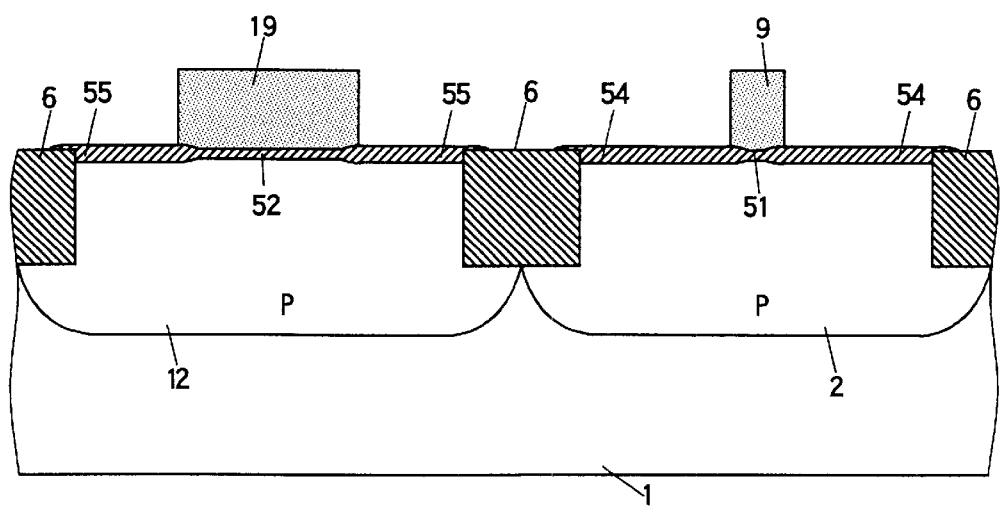
FIG. 17 is a cross-sectional view of a manufacturing step of the device of FIG. 16.

In manufacturing a device 104, the step of FIG. 4 in the method of the first preferred embodiment is replaced with the step of FIG. 17, in which the exposed surfaces of insulating films 51, 52 are subjected to a thermal oxidation treatment. Here, its temperature is adjusted in the range of 600° C. to 950° C., which are lower than those employed in general.

At this time, there are developed two processes: the diffusion of an oxidation seed (i.e., silicon) to regulate the oxidation reaction; and the surface reaction, which is dominant. As a result, the intrusion of the bird's beaks 8, 18 into the region directly beneath gate electrodes 9, 19 is relatively facilitated while suppressing the sinking of the bird's beaks 8, 18 due to the erosion in the upper surface of the semiconductor substrate 1.

Thus as compared to the device 101, the device 104 is more readily obtained without adding any complex steps, and also has a high resistance to punch through.

Fifth Preferred Embodiment

Figure 18:
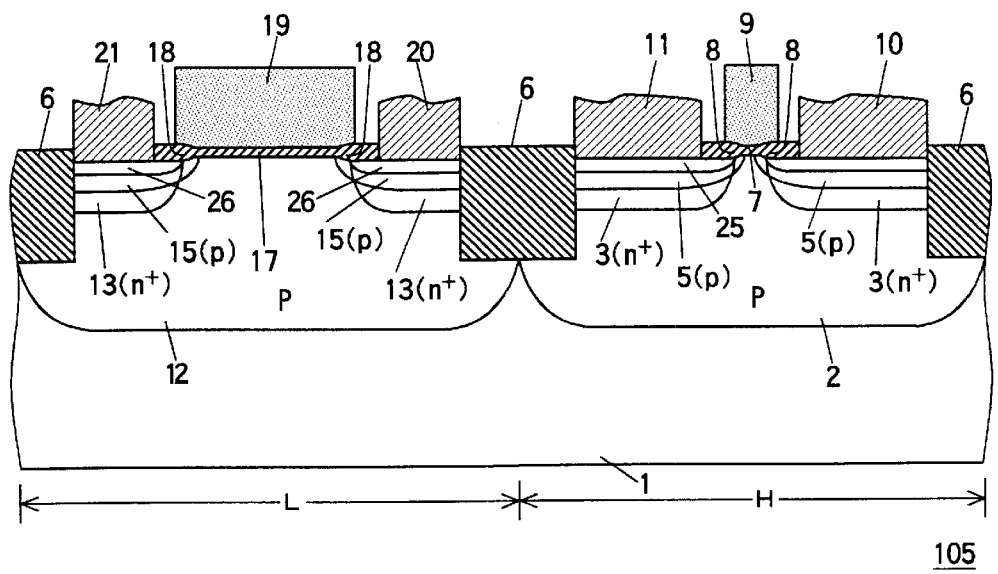
FIG. 18 is a cross-sectional view of a semiconductor device according to a fifth preferred embodiment of the present invention.

FIG. 18 is a cross-sectional view of a semiconductor device according to a fifth preferred embodiment. A semiconductor device 105 is characteristically different from the device 102 in that nitrogen implanted regions 25, 26 are selectively formed in the upper major surface of the portions of a semiconductor substrate 1 which are located directly beneath bird's beaks 8, 18, and in the upper surfaces of source/drain regions 3, 13. That is, the nitrogen implanted regions 25, 26 covers the entire bottom surfaces of the bird's beaks 8, 18.

Therefore, the depth of sink of the bird's beaks 8, 18 is controlled to be small, so that the resistance to punch through is increased as in the device 104. Further, since nitrogen piles up in the portions under the gate insulating films 7, 17, the resistance to hot carrier is increased at the same time. Although FIG. 18 shows an example in which the source/drain regions 3, 13 cover the bottom surfaces of the bird's beaks 8, 18, as in the device 102, it may be constructed in the same manner as in the device 101.

Figure 19:
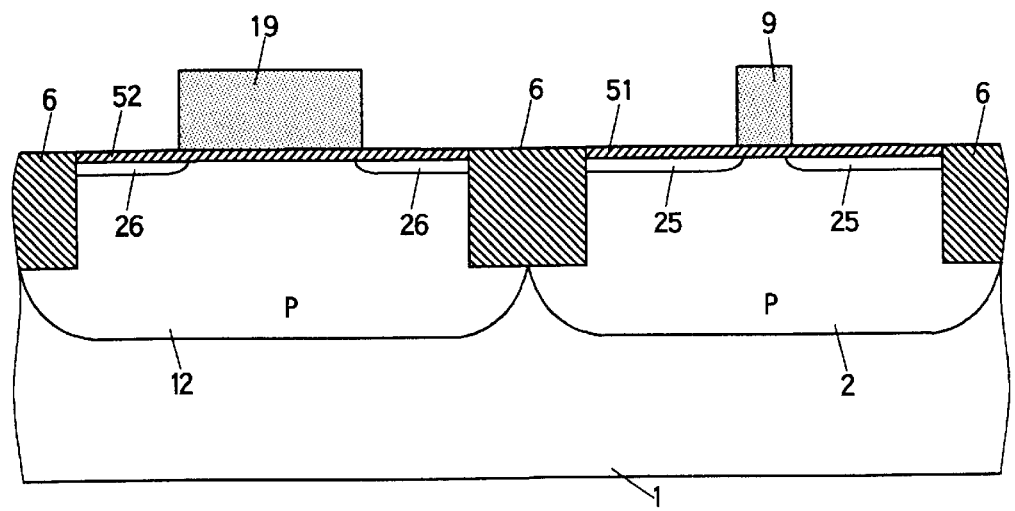
FIG. 19 and 20 are cross-sectional views showing a sequence of steps in a method for manufacturing the device of FIG. 18.
Figure 20:
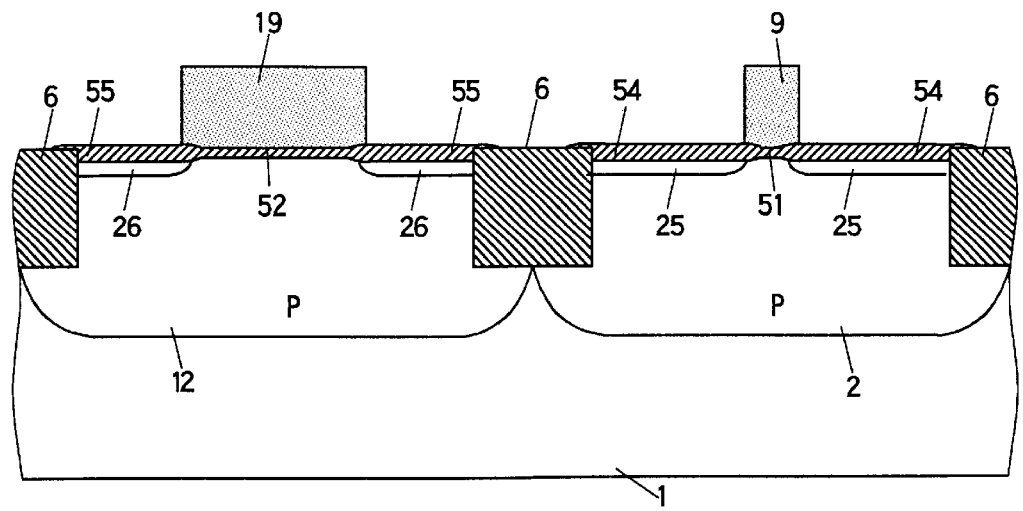

In manufacturing a device 105, after the step of FIG. 3 in the method of the third preferred embodiment, those of FIGS. 19 and 20, that of FIG. 5, and the subsequent steps are conducted in this order.

Referring to FIG. 19, nitrogen is selectively implanted into the upper major surfaces of wells 2, 12 by using the gate electrodes 9, 19 as a shied, to form nitrogen implanted regions 25, 26. The nitrogen is implanted at the energy in the range of from 10 keV to 30 keV and the dosage in the range of from $1 \times 10^{14}$ cm$^{-2}$ to $20 \times 10^{14}$ cm$^{-2}$.

Thereafter, in the step of FIG. 20 thick insulating films 54, 55 are formed by thermal oxidation treatment under the same conditions as in the step of FIG. 4. At this time, in the nitrogen implanted regions 25, 26, silicon as a base material is bonded to nitrogen, thereby making it difficult to bond to oxygen. This suppresses the insulating films 54, 55 from sinking during the oxidation treatment.

Thus, the device 105 is obtained more easily than the device 102 or 101, without adding any complex steps. Additionally, the device 105 has a high resistance to punch through.

Sixth Preferred Embodiment

Figure 21:
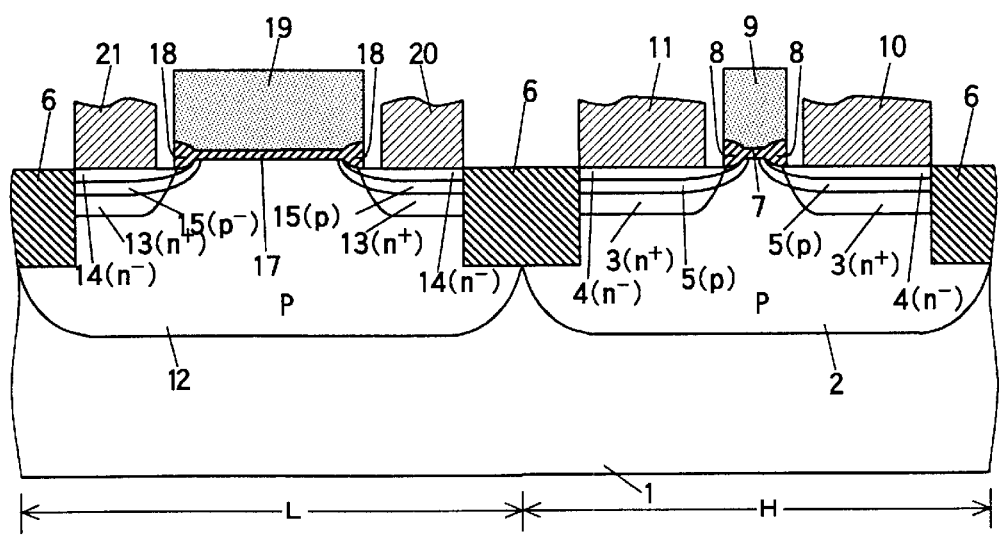
FIG. 21 is a cross-sectional view of a semiconductor device according to a sixth preferred embodiment of the present invention.

FIG. 21 is a cross-sectional view of a semiconductor device according to a sixth preferred embodiment. A semiconductor device 106 is characteristically different from the device 101 in that source/drain regions 3, 13 and the like are formed by implanting impurities after insulating films 54, 55 are removed. FIGS. 22 to 26 show a sequence of manufacturing steps characteristic in this embodiment. To obtain the device 106, the steps up to FIG. 4 in the first preferred embodiment are firstly conducted.

Figure 22:
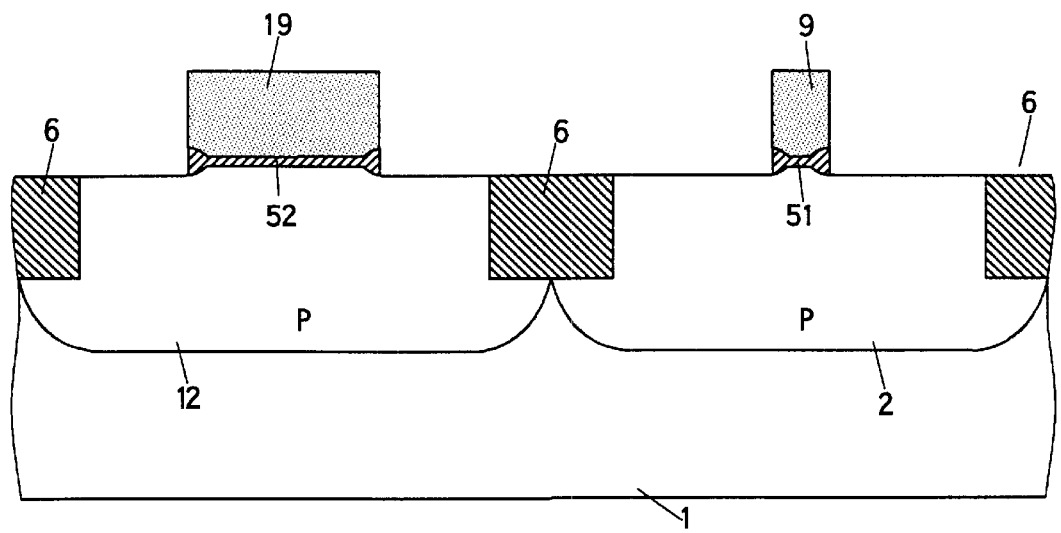
FIG. 22 to 26 are cross-sectional views showing a sequence of steps in a method for manufacturing the device of FIG. 21.

Referring to FIG. 22, with gate electrodes 9, 19 acting as a shield, an anisotropic etching is performed so that the thick insulating films 54, 55 are selectively removed.

Figure 23:
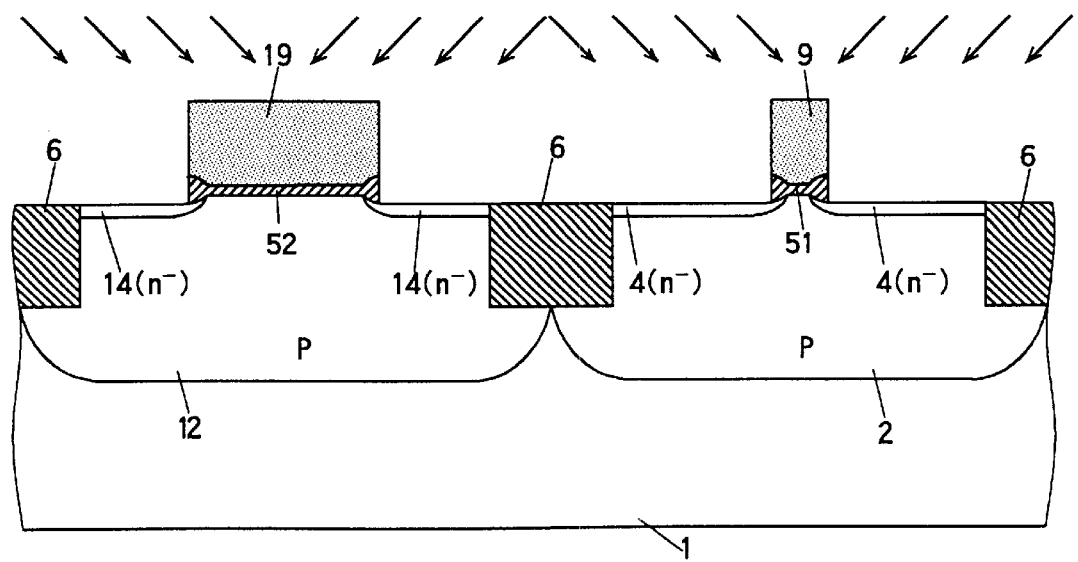

Referring to FIG. 23, with the gate electrodes 9, 19 acting as a shield, N type impurity, such as phosphorus or arsenic, is selectively implanted into the upper major surfaces of wells 2, 12, to form extension regions 4, 14. Here, an oblique implantation is preferably employed in order that the extension regions 4, 14 cover the region directly beneath the portions that correspond to the bird's beaks of the insulating films 54, 55.

Figure 24:
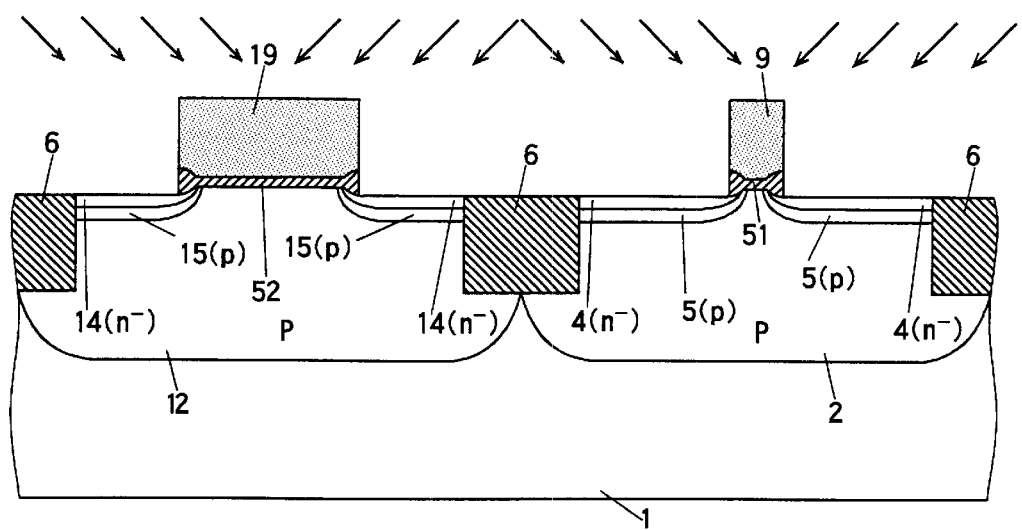

Referring to FIG. 24, with the gate electrodes 9, 19 acting as a shield, P type impurity, such as boron, is selectively implanted into the upper major surfaces of the wells 2, 12, to form pocket regions 5, 15. Here, an oblique implantation is preferably employed in order that the pocket regions 5, 15 include the extension regions 4, 14, respectively.

Figure 25:
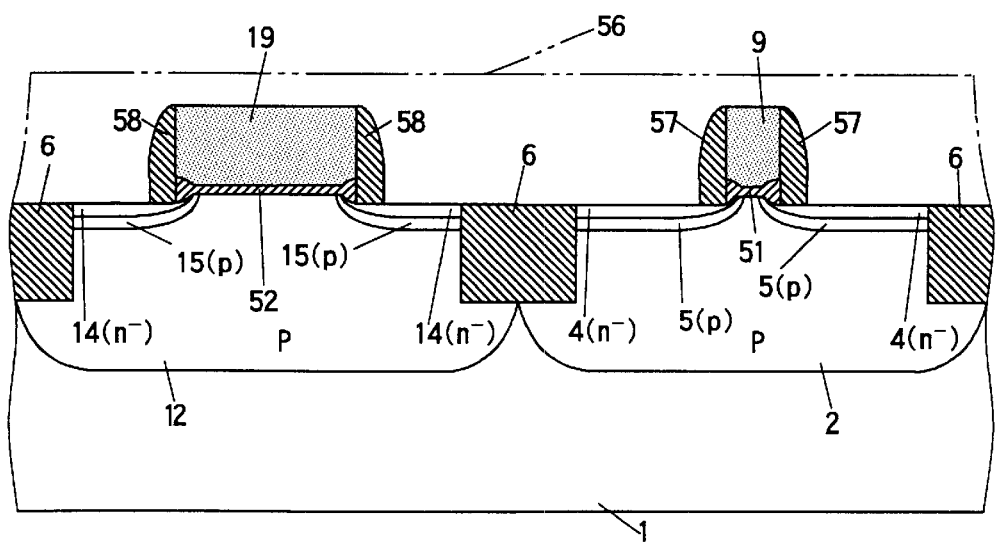

Referring to FIG. 25, a step similar to that of FIG. 7 is performed to form side walls 57, 58 on the side surfaces of the gate electrodes 9, 19, respectively.

Figure 26:
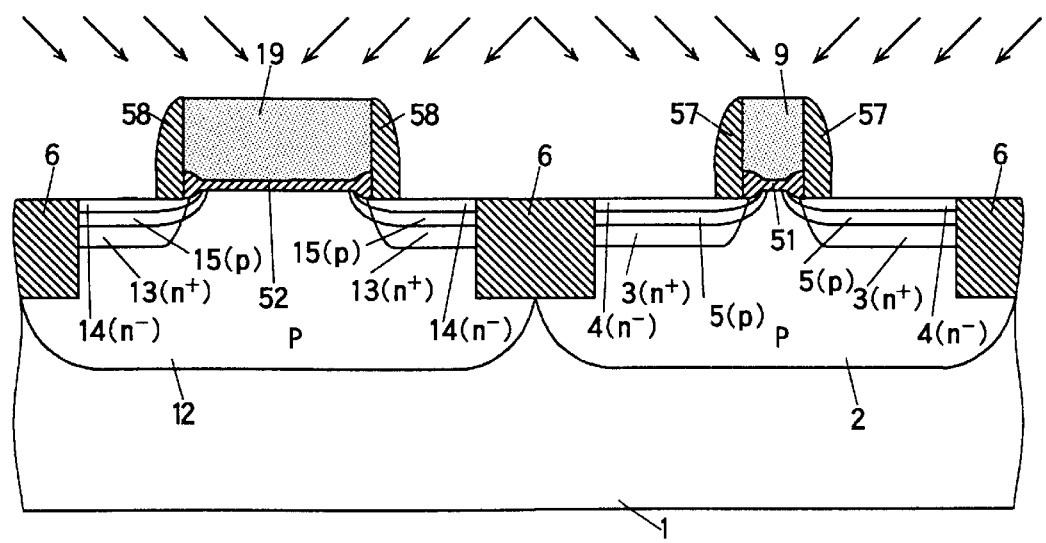

Referring to FIG. 26, with the gate electrodes 9, 19 and the side walls 57, 58 acting as a shield, N type impurity is implanted in a high concentration so that source/drain regions 3, 13 are selectively formed in the upper surfaces of the wells 2,12. Then, source electrodes 10, 20 and drain electrodes 11, 21 are connected to the upper surfaces of the source/drain regions 3, 13, resulting in the semiconductor device 106 shown in FIG. 21.

As stated above, in the method of manufacturing a device 106, the impurity implantations for forming the source/drain regions 3, 13 and other semiconductor regions are conducted after removing the insulating films 54, 55. This permits an effective implantation of impurity into the semiconductor substrate 1 without being shielded by the insulating films 54, 55. It is therefore possible to reduce the dose of impurity required in the implantation steps and to shorten manufacturing times, leading to an efficient manufacturing method.

In addition, since the impurity implantations can be performed at a low energy, it is possible to suppress the expansions of the source/drain regions 3, 13 and the extension regions 4, 14 to make them much shallower, thereby increasing the resistance to punch through.

Figure 27:
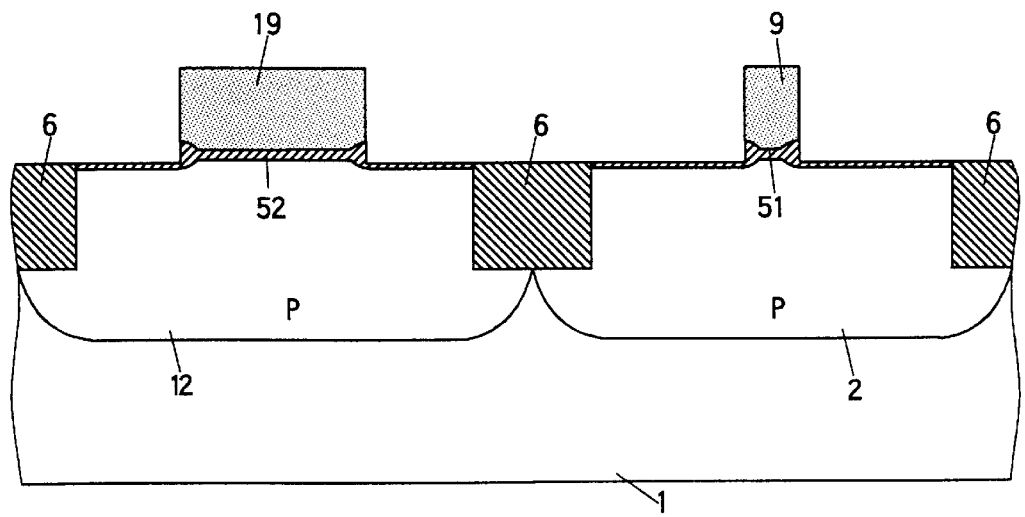
FIG. 27 is a cross-sectional view showing a step in another manufacturing method of the device of the sixth preferred embodiment.

The step of FIG. 22 may be replaced with that of FIG. 27. In the step of FIG. 27, insulating films 54, 55 are not removed until the upper surface of a semiconductor substrate 1 is exposed, to left them somewhat as a thin film. That is, the thicknesses of the thick insulating films 54, 55 are selectively thinned. These thinned insulating films 54, 55 are selectively removed when forming major electrodes 10, 11, 20 and 21. For instance, the thicknesses of the insulating films 54, 55 formed by the step of FIG. 4 is 100 nm. The films 54, 55 are selectively removes until their thicknesses are zero in the step of FIG. 22. Their thickness are reduced so that they are not more than 300 nm in the step of FIG. 27.

Thus, during the impurity implantations and other steps, it is possible to prevent the source/drain regions 3, 13 to be connected to the major electrodes 10, 11, 20, 21, from being contaminated by heavy metal and carbon. As a result, an improved resistance to punch through and improved junction characteristics of the source/drain regions 3, 13 are attained at the same time.

Seventh Preferred Embodiment

Figure 28:
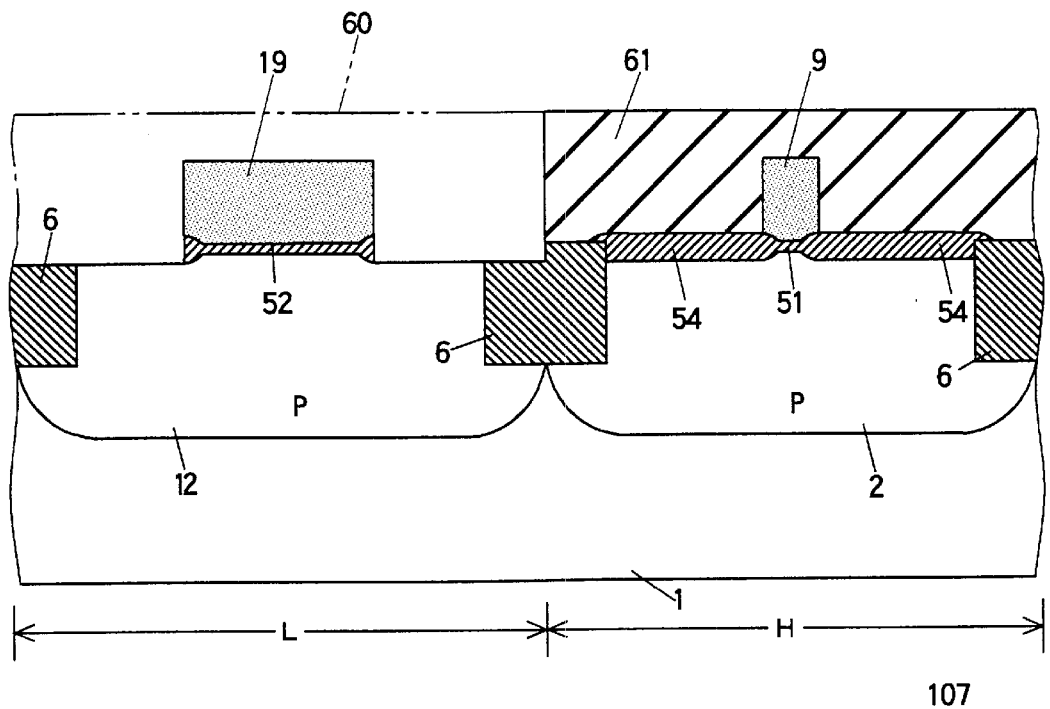
FIG. 28 and 29 are cross-sectional views showing a sequence of steps in a manufacturing method according to a seventh preferred embodiment of the present invention.
Figure 29:
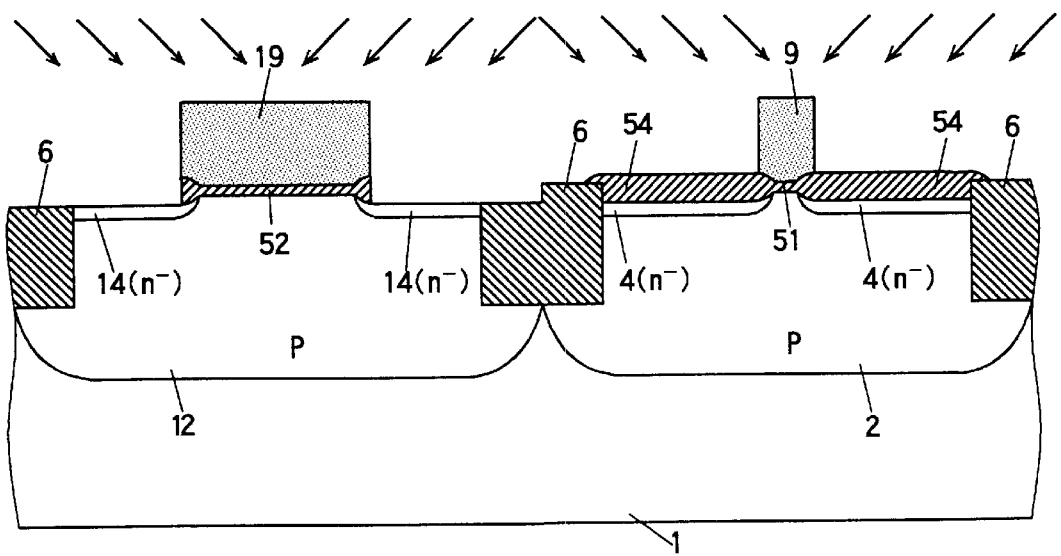

FIGS. 23 and 29 are manufacturing steps of a semiconductor device according to a seventh preferred embodiment. A semiconductor device 107 obtained through these steps is shown alike in FIG. 21 and therefore its illustration is omitted. To obtain the device 107, firstly the manufacturing steps up to FIG. 4 in the first preferred embodiment are conducted, followed by the step of FIG. 28.

Referring to FIG. 28, a shield material 60 is stacked over the entire surface of the intermediate product after the manufacturing step of FIG. 4 is completed. The shield material 60 is selectively etched to form a shield 61 that covers an insulating film 54 and has an opening in an insulating film 55. Then, the part of the insulating film 55 which is covered with neither the shield 61 nor a gate electrode 19, is selectively removed.

Referring to FIG. 29, in the state in which the insulating film 54 is left in a high-voltage element H region and the insulating film 55 is selectively removed in a low-voltage L region, N type impurity is implanted to form extension regions 4, 14. In the same manner, the respective impurity implantations are performed to form pocket regions 5, 15 and source/drain regions 3, 13. Thereafter, major electrodes 10, 11, 20, 21 are connected to the source/drain regions 3, 13, resulting in a semiconductor device 107.

As set forth above, in the method of manufacturing a device 107, the impurity implantations for forming the source/drain regions 3, 13 and other semiconductor regions are conducted in the state in which the thick insulating films are left in part of elements and removed in the rest. Therefore, this method is suited for manufacturing semiconductor devices comprising both an element that gives precedence to the prevention of junction characteristics degradation over the improvement in resistance to punch through, and a different type element.

FIG. 27 shows the case where the high-voltage element H is the element that is particularly required to have excellent junction characteristics. For example, a device 107 is DRAM, a high-voltage element H is MOS transistor that belongs to a memory cell, and a low-voltage element L is MOS transistor that belongs to a peripheral circuit. For MOS transistor that belongs to a memory cell, it is particularly required to avoid junction leaks which may occur due to the contamination of source/drain regions. Therefore, it is desirable to leave an insulating film 54.

It is also possible to manufacture a device 107 by another method as described below. Firstly, the steps up to FIG. 27 in the method of the sixth preferred embodiment are conducted and the step of FIG. 30 is then conducted.

Figure 30:
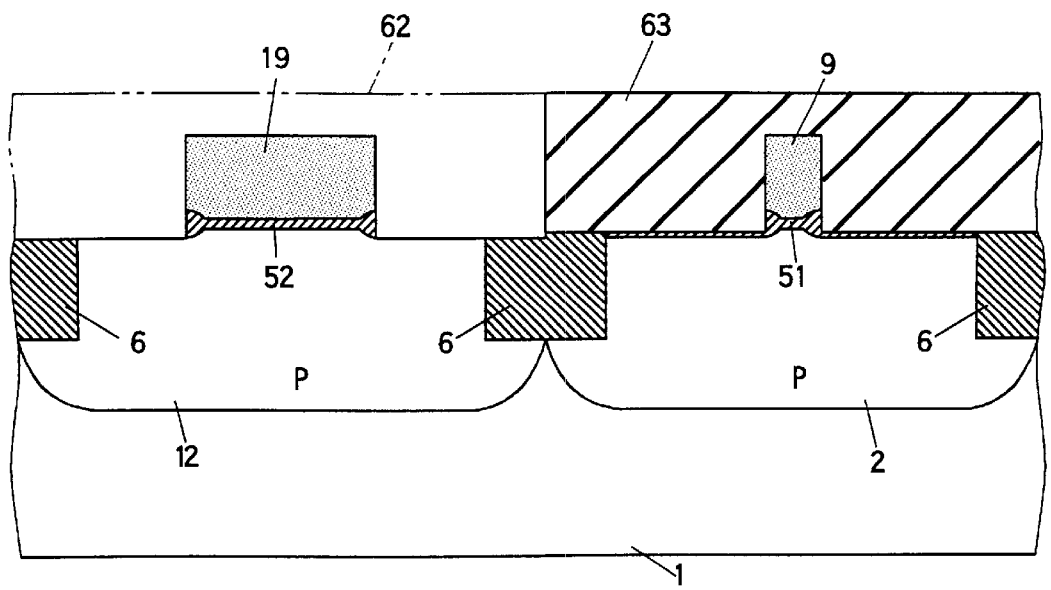
FIG. 30 and 31 are cross-sectional views showing a sequence of steps in another manufacturing method according to the seventh preferred embodiment.

Referring to FIG. 30, a shield material 62 is stacked over the entire surface of the intermediate product obtained after the step of FIG. 27 is completed. The shield material 62 is then selectively etched to form a shield 63 that covers an insulating film 54 and has an opening in an insulating film 55. Then, the part of the insulating film 55 which is covered with neither the shield 63 nor a gate electrode 19, is selectively removed.

Figure 31:
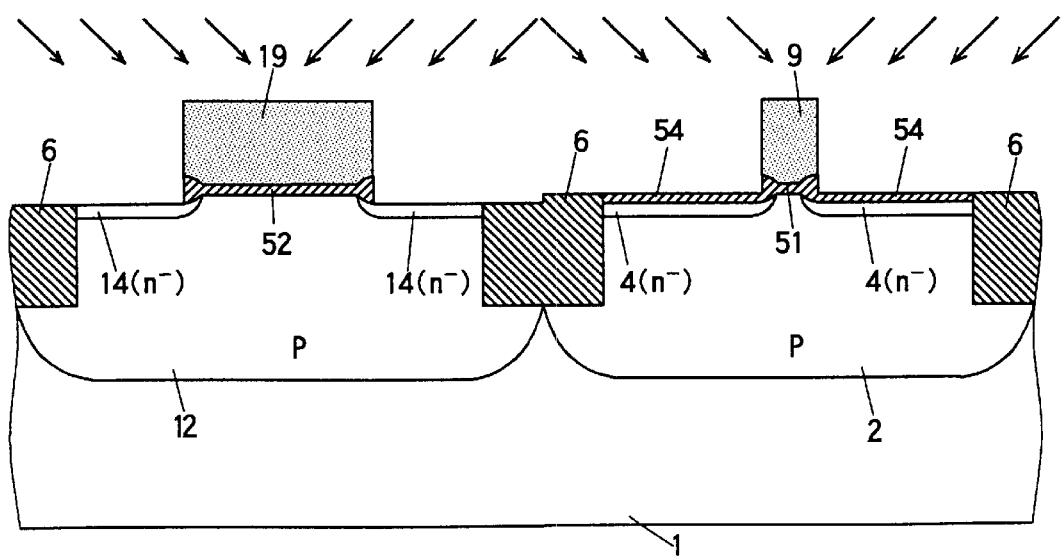

Referring to FIG. 31, N type impurity is implanted to form extension regions 4, 14. In the same manner, the respective impurity implantations are performed to form pocket regions 5, 15 and source/drain regions 3, 13. Thereafter, major electrodes 10, 11, 20, 21 are connected to the source/drain regions 3, 13, resulting in a semiconductor device 107.

Thus, in this method the impurity implantations for forming the source/drain regions 3, 13 and other semiconductor regions are conducted in the state in which the insulating film is left as a thinned insulating film in part of elements and removed in the rest. This enables to improve the resistance to punch through for all elements, while maintaining high junction characteristics in the elements that gives precedence to the prevention of junction characteristics degradation.

Eighth Preferred Embodiment

Figure 32:
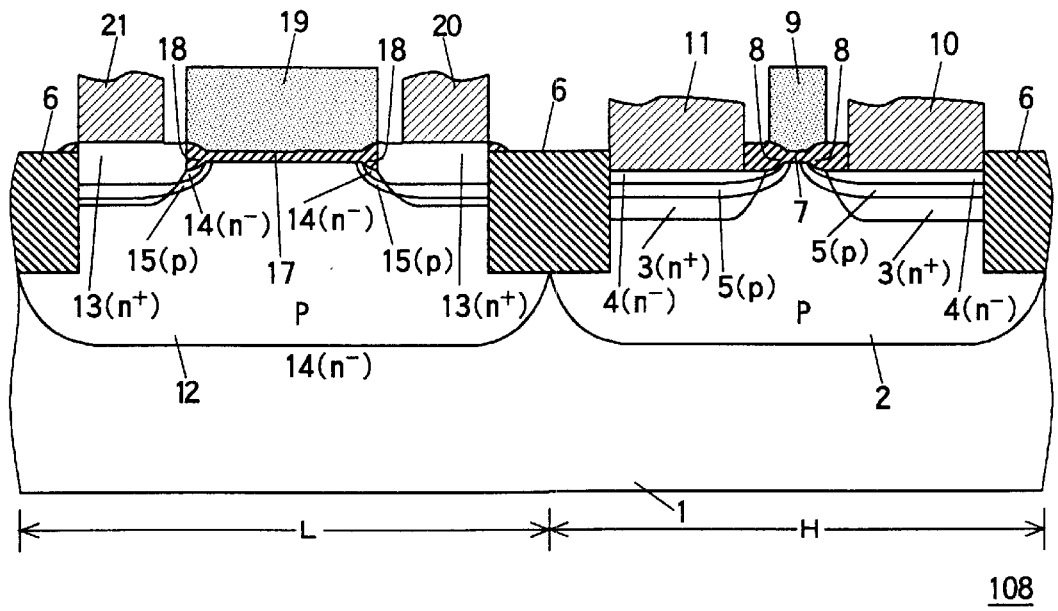
FIG. 32 is a cross-sectional view of a semiconductor device according to an eighth preferred embodiment of the present invention.

FIG. 32 is a cross-sectional view of a semiconductor device according to an eighth preferred embodiment. A semiconductor device 108 is characteristically different from the device 101 in that the upper surface of a source/drain region 13 of a low-voltage element L as one element, is higher than the bottom surface of a bird's beak 18 and located in the vicinity of its upper surface. Accordingly, the bottom of the source/drain region 13 is close to the bottom surface of the bird's beak 18 and located in a position higher than that in the device 101. That is, the depth of the source/drain region 13 on the basis of the bottom surface of a gate insulating film 17, is set to be shallow. This further increases the resistance to punch through.

Figure 33:
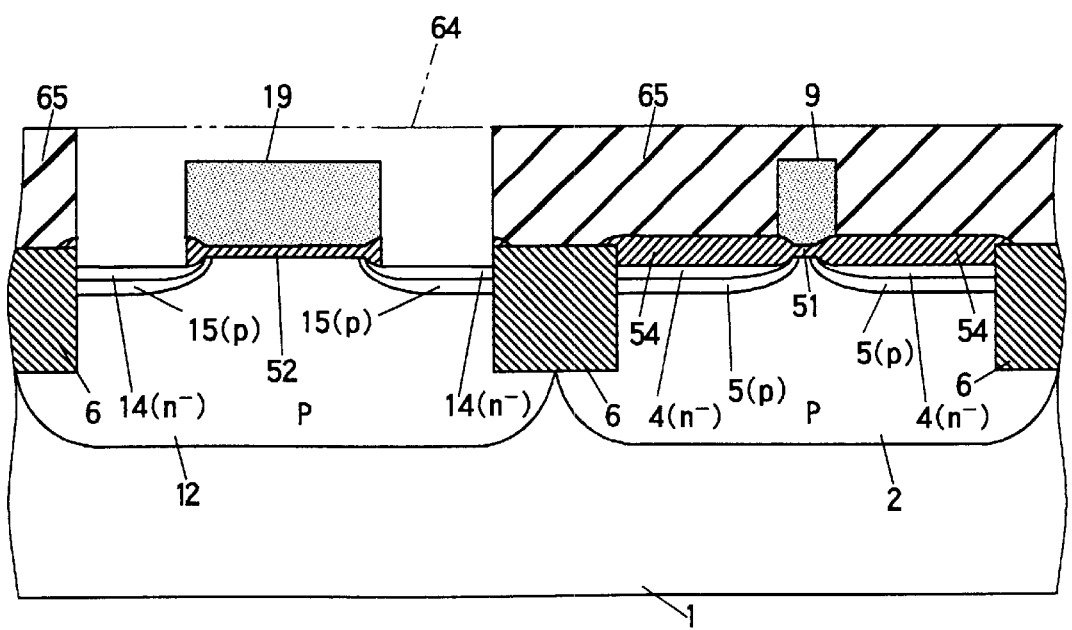
FIG. 33 to 35 are cross-sectional views showing a sequence of steps in a method for manufacturing the device of FIG. 32.

In manufacturing a semiconductor device 108, firstly the steps up to FIG. 6 in the method of the first preferred embodiment are conducted, followed by the step of FIG. 33.

Referring to FIG. 33, a shield material 64 is stacked over the entire surface of the intermediate product obtained after the step of FIG. 6 is completed. The shield material 64 is then selectively etched to form a shield 65 that covers a high-voltage element H and has an opening in a low-voltage element L. Then, the part of an insulating film 55 which is covered with neither the shield 65 nor a gate electrode 19, is selectively removed by anisotropic etching.

Figure 34:
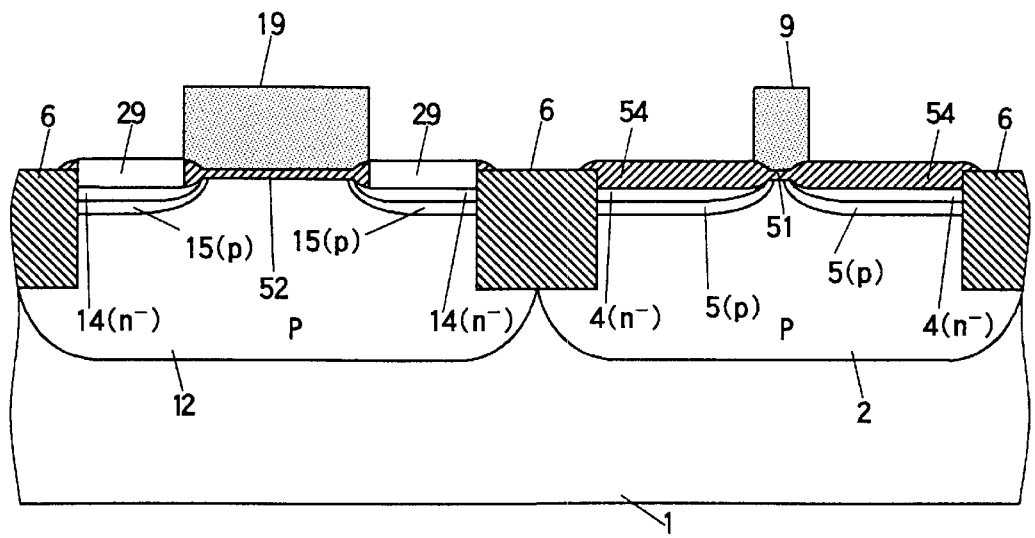

Referring to FIG. 34, a silicon layer 29 is deposited on the exposed surface of a semiconductor substrate 1 in the low-voltage element L region. The silicon layer 29 is easily deposited by known selective epitaxial growth. The silicon layer 29 is deposited to the degree in which its upper surface is parallel to the upper surface of a bird's beak 18. When the thickness of the bird's beak 18 is about 100 nm, that of the silicon layer 29 is about 50 nm. Here, the silicon layer 29 may be a pure silicon layer or contain dopants, such as germanium.

Figure 35:
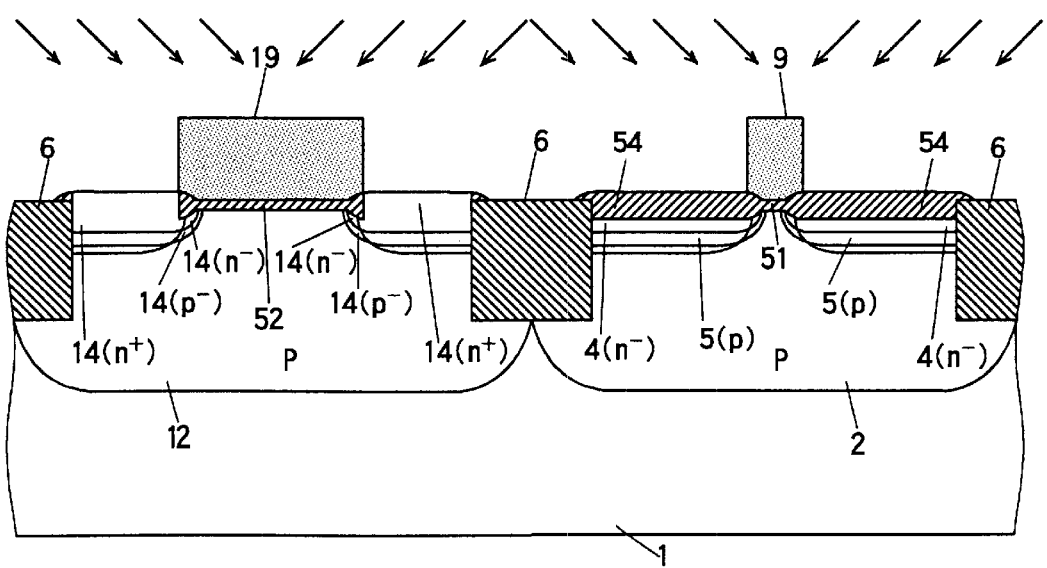

Referring to FIG. 35, with the gate electrodes 9, 19 acting as a shield, N type impurity is implanted in high concentrations so that source/drain regions 3, 13 are selectively formed in the upper surfaces of wells 2, 12. Alternatively, side walls 57, 58 are firstly formed as in the step of FIG. 8, and then employed as a shield. As in the source/drain regions 3, 13, the impurity implantations for forming extension regions 4, 14 and pocket regions 5, 15 can be performed after the silicon layer 29 is formed.

When the step of FIG. 35 is completed, the source/drain region 13 in the low-voltage element L region is shifted upward by the amount corresponding to the thickness of the silicon layer 29. That is, since N type impurity implantation is conducted after the silicon layer 29 is stacked, the source/drain region 13 of the low-voltage element L region on which the silicon layer 29 is formed, is shallow by the amount of the thickness of the silicon layer 29, on the basis of the bottom surface of a gate insulating film 17. The silicon layer 29 becomes part of the source/drain region 13.

Thereafter, major electrodes 10, 11, 20, 21 are connected to the source/drain regions 3, 13, resulting in a semiconductor device 108.

As set forth above, the device 108 particularly excellent in the resistance to punch through can be obtained by adding a relatively simple step into the method of the first preferred embodiment.

Although the eighth preferred embodiment demonstrates the example in which the silicon layer 29 is selectively formed only on the low-voltage element L, it is possible to form a silicon layer 29 for all elements, thereby improving their resistance to punch through. In this case, the step of forming a shield 65 as shown in FIG. 33 is unnecessary so that the manufacturing method is further simplified.

Ninth Preferred Embodiment

Figure 36:
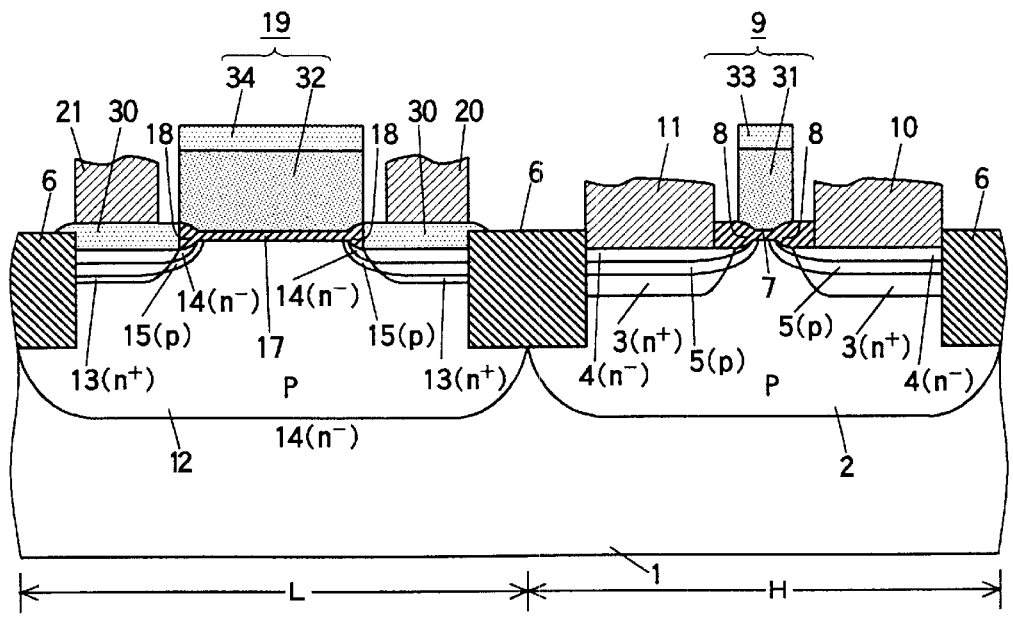
FIG. 36 is a cross-sectional view of a semiconductor device according to a ninth preferred embodiment of the present invention.

FIG. 36 is a cross-sectional view of a semiconductor device according to a ninth preferred embodiment. A semiconductor device 109 is characteristically different from the device 101 in that a silicide layer 30 is deposited on the upper surface of a source/drain region 13 of a low-voltage element L as one element. Through the silicide layer 30, the source/drain region 13 is connected to major electrodes 20, 21.

Accordingly, the contact resistance between the source/drain region 13 and the major electrode 20, 21 is reduced so that the current driving capability and operation speed are increased. In addition, silicide layers 33 and 34 are formed on the upper surfaces of gate electrodes 9 and 19, respectively. This also contributes to an increase in operation speed through a reduction in the electric resistance of the gate electrodes 9, 19.

Figure 37:
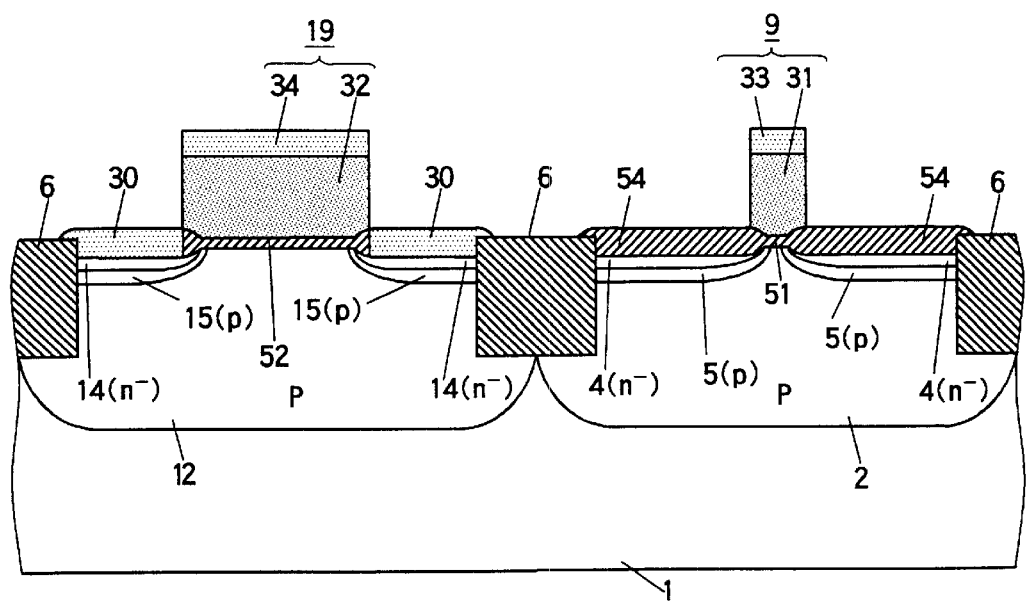
FIG. 37 is a cross-sectional view of a manufacturing step of the device of FIG. 36.

In manufacturing a semiconductor device 109, firstly the steps up to that in FIG. 33 are conducted, followed by the step of FIG. 37. Prior to the step of FIG. 37, polysilicon layers 31 and 32 are formed as gate electrodes 9 and 19, respectively.

Referring to FIG. 37, metal, such as W, Ti, Co, Ni or Pt, alternatively, a silicide containing such metal as a component, is deposited on the exposed surface of a semiconductor substrate 1 in a low-voltage element L region and on the upper surfaces of the polysilicon layers 31, 32. It is deposited in 10 nm thick, for example.

Next, a thermal treatment is conducted to cause a silicidation between the above metal or silicide, and the substrate 1 and the polysilicon layers 31, 32, so that a silicide layer 30 is deposited on the upper surface of the substrate 1 in the low voltage element L region, and other silicide layers 33, 34 are deposited on the polysilicon layers 31, 32.

Thereafter, in the same manner as in FIG. 35, N type impurity is implanted to form source/drain regions 3, 13, and major electrodes 10, 11, 20, 21 are then connected to the source/drain regions 3, 13, resulting in a semiconductor device 109. The source/drain region 13 is connected to the major electrodes 20, 21, through the silicide layer 30. The impurity implantations for forming extension regions 4, 14, pocket regions 5, 15 and source/drain regions 3, 13 can be performed after a suicide layer 30 is formed.

As set forth above, it is possible to manufacture a device 109 particularly excellent in high-speed operation by adding a relatively simple step into the method of the first preferred embodiment.

The ninth preferred embodiment demonstrates the case where a high-voltage element H is the element that is particularly required to have excellent junction characteristics. For example, a device 109 is DRAM, a high-voltage element H is MOS transistor that belongs to a memory cell, and a low-voltage element L is MOS transistor that belongs to a peripheral circuit. As previously described, MOS transistor that belongs to a memory cell is particularly required to avoid junction leaks, and therefore, it is desirable to leave an insulating film 54

On the other hand, in a semiconductor device in which each element is not particularly required to avoid junction leaks, a silicon layer 30 can be provided for all elements, thereby improving their operation speed. In this case, the step of forming a shield 65 as shown in FIG. 33 is unnecessary so that the manufacturing method is further simplified.

Tenth Preferred Embodiment

Figure 38:
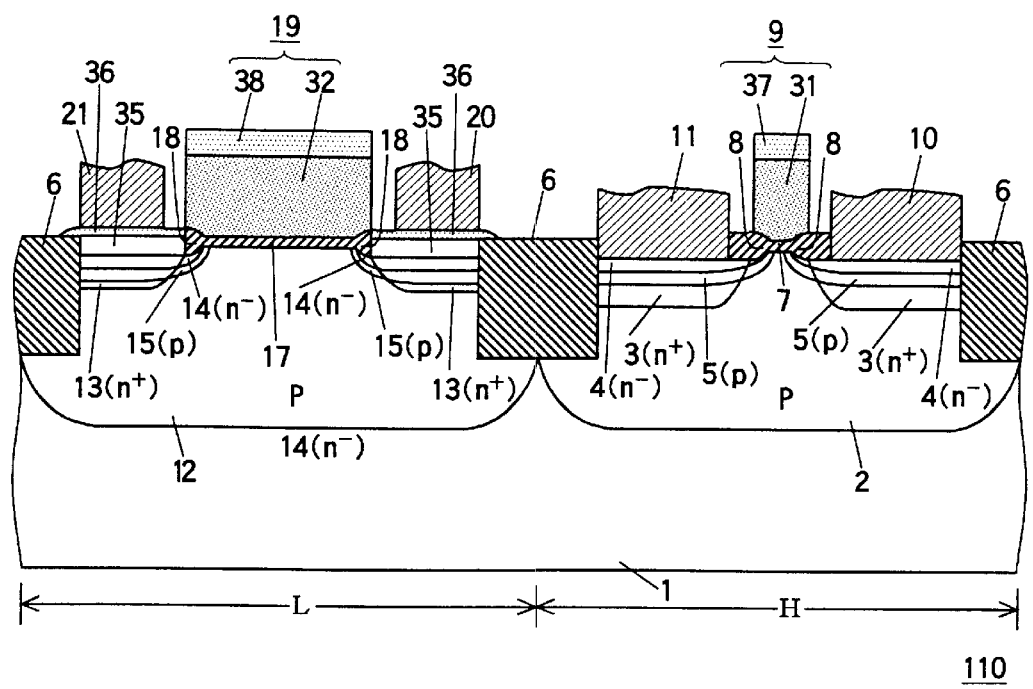
FIG. 38 is a cross-sectional view of a semiconductor device according to a tenth preferred embodiment of the present invention.

FIG. 38 is a cross-sectional view of a semiconductor device according to a tenth preferred embodiment. A semiconductor device 110 is characteristically different from the device 101 in that a silicon layer 35 and a silicide layer 36 are deposited on the upper surface of a source/drain region 13 of a low-voltage element L as one element. Through the silicide layer 36, the source/drain region 13 is connected to major electrodes 20, 21. Like the device 109, silicide layers 37, 38 are formed on gate electrodes 9, 19.

Accordingly, the contact resistance between the source/drain region 13 and the major electrode 20, 21 is reduced so that the current driving capability and operation speed are increased. In addition, silicide layers 37 and 38 are formed on the upper surfaces of gate electrodes 9 and 19, respectively. This also contributes to an increase in operation speed through a reduction in the electric resistance of the gate electrodes 9, 19. Since the source/drain region 13 is shallow by the thickness of the silicon layer 35, the resistance to punch through is increased as in the device 108.

Although it is known that in forming a silicide layer 36 there occurs a spike that projects from a silicide layer 36 to a semiconductor device 1, even if a spike occurs, its location is retired by the amount corresponding to the thickness of the silicon layer 35. Therefore, if the source/drain region 13 is not formed shallow so that it is shallow by the thickness of the silicon layer 35, it is possible to suppress junction leaks caused when a spike breaks the junction surface between the source/drain region 13 and a well 12, thereby improving junction characteristics.

Figure 39:
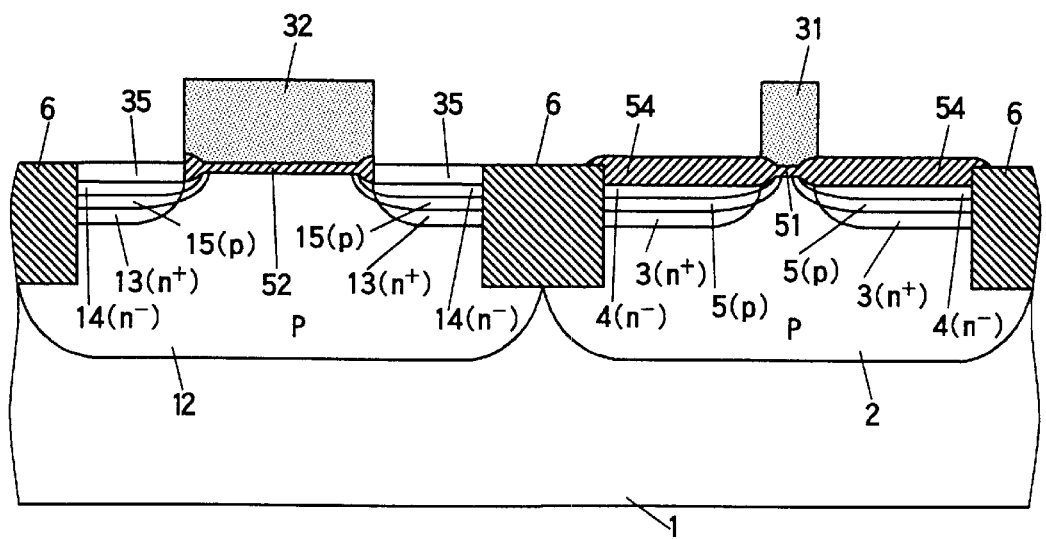
FIG. 39 is a cross-sectional view of a manufacturing step of the device of FIG. 38.
Figure 40:
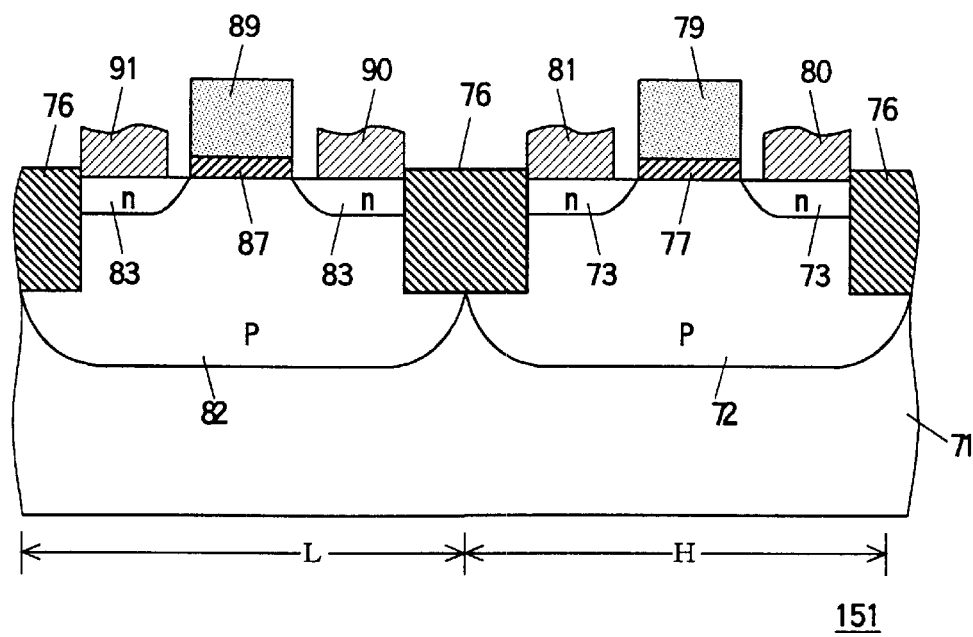
FIG. 40 is a cross-sectional view of a conventional semiconductor device.
Figure 41:
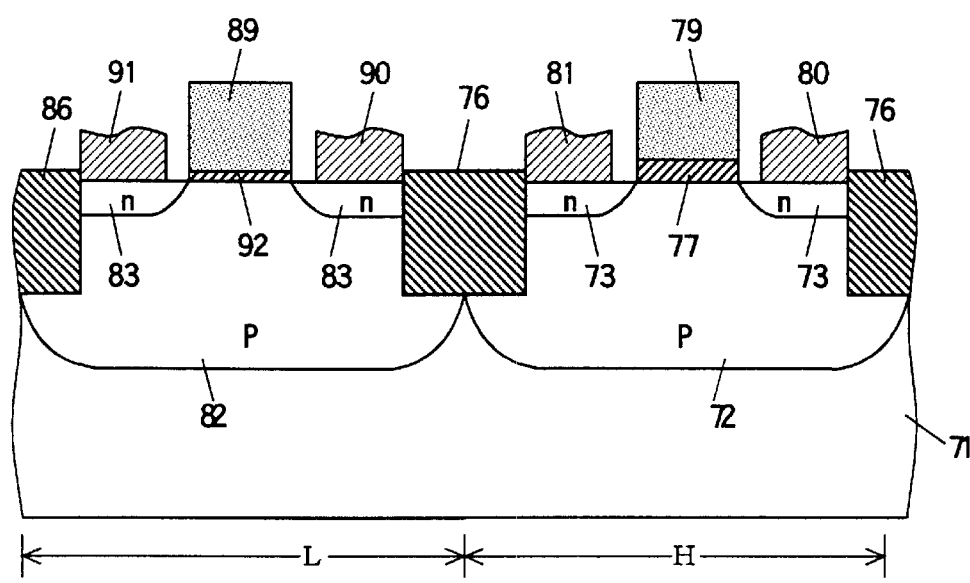
FIG. 41 is a cross-sectional view of another conventional semiconductor device.

In manufacturing a semiconductor device 110, firstly the steps up to that of FIG. 33 in the eighth preferred embodiment are conducted, followed by the step of FIG. 39. Prior to the step of FIG. 39, polysilicon layers 31 and 32 are formed as gate electrodes 9 and 19, respectively.

Referring to FIG. 39, a silicon layer 35 is firstly deposited on the exposed surface of a semiconductor substrate 1 in a low-voltage element L region. Like the step of FIG. 34, a selective epitaxial growth is employed to deposit a silicon layer 35. When the thickness of a bird's beak 18 is about 100 nm, the silicon layer 35 is deposited in about 50 nm thick, for example. Thereafter, with the polysilicon layers 31, 32 acting as a shield, N type impurity is implanted to form source/drain regions 3, 13.

At this time the silicon layer 35 becomes part of the source/drain region 13. The depth of the source/drain region 13 on the basis of the bottom surface of a gate insulating film 17 is reduced by the thickness of the silicon layer 35. Then, as shown in FIG. 38, metal, such as W, Ti, Co, Ni or Pt, alternatively, a silicide containing such metal as a component, is deposited on the upper surface of the silicon layer 35 and the upper surfaces of the polysilicon layers 31, 32. It is stacked in 10 nm thick, for example.

Next, a thermal treatment is conducted to cause a silicidation between the above metal or silicide, and the silicon layer 35 and the polysilicon layers 31, 32, so that a silicide layer 36 is deposited on the upper surface of the silicon layer 35, and other silicide layers 37, 38 are deposited on the polysilicon layers 31, 32.

As in the source/drain regions 3, 13, the steps of impurity implantations for forming extension regions 4, 14 and pocket regions 5, 15 can be performed after forming a silicon layer 35. Alternatively, these steps can be performed after forming a silicide layer 36. In order to suppress the influence of spike, the impurity implantation for forming source/drain regions 3, 13 can be performed before a silicon layer 35 is formed.

Thereafter, the source/drain regions 3, 13 extending into the silicon layer 35 are connected to major electrodes 10, 11, 20, 21, resulting in a semiconductor device 110. The source/drain region 13 is connected to the major electrodes 20, 21, through the silicide layer 36.

As set forth above, by adding a relatively simple step into the method of the first preferred embodiment, a device 110 particularly excellent in punch through characteristics and high-speed operation is obtained while suppressing junction leaks.

The tenth preferred embodiment demonstrates the case where a high-voltage element H is the element that is particularly required to have excellent junction characteristics. For example, a device 110 is DRAM, a high-voltage element H is MOS transistor that belongs to a memory cell, and a low-voltage element L is MOS transistor that belongs to a peripheral circuit. As previously described, MOS transistor that belongs to a memory cell is particularly required to avoid junction leaks, and therefore, it is desirable to leave an insulating film 54.

On the other hand, in a semiconductor device in which each element is not particularly required to avoid junction leaks, a silicon layer 35 and a silicide layer 36 can be provided for all elements, thereby improving their operation speed and resistance to punch through. In this case, the step of forming a shield 65 as shown in FIG. 33 is unnecessary so that the manufacturing method is further simplified.

Modifications (A) The foregoing preferred embodiments demonstrate the cases where elements to be formed on a semiconductor substrate 1 are of N type MOS transistor, however, the present invention is applicable to the case of P type MOS transistors, resulting in the same effects.

(B) The foregoing preferred embodiments demonstrate the cases where elements to be formed on a semiconductor substrate 1 are MOS transistors, however, the present invention is also applicable to general semiconductor devices in which the insulating gate type semiconductor element having MOS structure is provided in one major surface of a semiconductor substrate. That is, the present invention can be widely applied to general semiconductor devices comprising: a pair of semiconductor regions of a first conductivity type; a semiconductor region of a second conductivity type that is the channel region surrounded by the first conductivity type regions, which are all disposed along one major surface of a semiconductor substrate; IGBT having MOS structure in which a gate electrode is opposed to the channel region through an insulating film; a thyristor; and other semiconductor elements of the insulating gate type.

(C) The foregoing preferred embodiments demonstrate the cases where major electrodes 10, 11, 20, 21 are connected to the upper surface of a semiconductor substrate 1 to which gate electrodes 9, 19 are opposed, however, the present invention is not limited to such a construction and applicable to semiconductor devices of the insulating gate type (e.g., the vertical type IGBTs) in which part of major electrodes is connected to the bottom surface of a semiconductor substrate 1.

While the invention has been shown and described in detail, the foregoing description is in all aspects illustrative and not restrictive. It is therefore understood that numerous modifications and variations can be devised without departing from the scope of the invention.

We claim:

1. A semiconductor device having a plurality of elements sharing a common semiconductor substrate, each of said elements comprising:
    (a) a first semiconductor region of a first conductivity type formed in said semiconductor substrate, said first semiconductor region extending to a first depth in said semiconductor substrate and having an outer surface;
    (b) a pair of second semiconductor regions of a second conductivity type formed apart from each other and extending into said first semiconductor region to a second depth which is shallower than the first depth;
    (c) a gate insulating film disposed on at least said outer surface of said first semiconductor region; and
    (d) a gate electrode disposed on said gate insulating film, wherein each gate electrode has a length measured in a direction from one of a corresponding pair of said second semiconductor regions to the other of said corresponding pair of said second semiconductor regions and at least one first kind of said elements has a gate electrode that has a shorter length than the length of the gate electrode of at least one second kind of said elements and each corresponding said gate insulating film includes a corresponding pair of bird's beaks having a corresponding pair of thick portions adjacent to corresponding outside edges of a corresponding gate electrode and a corresponding pair of tapering portions extending from and thinner than the corresponding pair of thick portions beneath said each gate electrode, and
    wherein at least said corresponding pair of tapering portions of the second kind of elements are joined by a length of said gate insulating film forming a corresponding central portion that is thinner than said corresponding pair of thick portions with a ratio of a combined length of said corresponding pair of bird's beaks and the length of the corresponding central portion having a larger value relative to said first kind of elements than relative to said second kind of elements, and further
    wherein each of said elements further comprises a pair of extension regions of the second conductivity type formed apart from each other in a corresponding said first region with said pair of extension regions each extending below at least the corresponding thick and tapering portions and being formed to a depth less than the second depth with a lower impurity concentration than said pair of second semiconductor regions.

2. A semiconductor device having a plurality of elements sharing a common semiconductor substrate, each of said elements comprising:
    (a) a first semiconductor region of a first conductivity type formed in said semiconductor substrate, said first semiconductor region extending to a first depth in said semiconductor substrate and having an outer surface;
    (b) a pair of second semiconductor regions of a second conductivity type formed apart from each other and extending into said first semiconductor region to a second depth which is shallower than the first depth;
    (c) a gate insulating film disposed on at least said outer surface of said first semiconductor region; and
    (d) a gate electrode disposed on said gate insulating film, wherein each gate electrode has a length measured in a direction from one of a corresponding pair of said second semiconductor regions to the other of said corresponding pair of said second semiconductor regions and at least one first kind of said elements has a gate electrode that has a shorter length than the length of the gate electrode of at least one second kind of said elements and each corresponding said gate insulating film includes a corresponding pair of bird's beaks having a corresponding pair of thick portions adjacent to corresponding outside edges of a corresponding gate electrode and a corresponding pair of tapering portions extending from and thinner than the corresponding pair of thick portions beneath said each gate electrode, and
    wherein at least said corresponding pair of tapering portions of the second kind of elements are joined by a length of said gate insulating film forming a corresponding central portion that is thinner than said corresponding pair of thick portions with a ratio of a combined length of said corresponding pair of bird's beaks and the length of the corresponding central portion having a larger value relative to said first kind of elements than relative to said second kind of elements, and further
    wherein said pair of second semiconductor regions extend along bottom portions of said corresponding pair of said bird's beaks.

3. A semiconductor device having a plurality of elements sharing a common semiconductor substrate, each of said elements comprising:
    (a) a first semiconductor region of a first conductivity type formed in said semiconductor substrate, said first semiconductor region extending to a first depth in said semiconductor substrate and having an outer surface;

(b) a pair of second semiconductor regions of a second conductivity type formed apart from each other and extending into said first semiconductor region to a second depth which is shallower than the first depth;

(c) a gate insulating film disposed on at least said outer surface of said first semiconductor region; and (d) a gate electrode disposed on said gate insulating film, wherein each gate electrode has a length measured in a direction from one of a corresponding pair of said second semiconductor regions to the other of said corresponding pair of said second semiconductor regions and at least one first kind of said elements has a gate electrode that has a shorter length than the length of the gate electrode of at least one second kind of said elements and each corresponding said gate insulating film includes a corresponding pair of bird's beaks having a corresponding pair of thick portions adjacent to corresponding outside edges of a corresponding gate electrode and a corresponding pair of tapering portions extending from and thinner than the corresponding pair of thick portions beneath said each gate electrode, and wherein at least said corresponding pair of tapering portions of the second kind of elements are joined by a length of said gate insulating film forming a corresponding central portion that is thinner than said corresponding pair of thick portions with a ratio of a combined length of said corresponding pair of bird's beaks and the length of the corresponding central portion having a larger value relative to said first kind of elements than relative to said second kind of elements, and further wherein at least one said first kind of elements has each of said pair of corresponding tapering portions in direct contact.

4. A semiconductor device having a plurality of elements sharing a common semiconductor substrate, each of said elements comprising:

(a) a first semiconductor region of a first conductivity type formed in said semiconductor substrate, said first semiconductor region extending to a first depth in said semiconductor substrate and having an outer surface;

(b) a pair of second semiconductor regions of a second conductivity type formed apart from each other and extending into said first semiconductor region to a second depth which is shallower than the first depth;

(c) a gate insulating film disposed on at least said outer surface of said first semiconductor region; and (d) a gate electrode disposed on said gate insulating film, wherein each gate electrode has a length measured in a direction from one of a corresponding pair of said second semiconductor regions to the other of said corresponding pair of said second semiconductor regions and at least one first kind of said elements has a gate electrode that has a shorter length than the length of the gate electrode of at least one second kind of said elements and each corresponding said gate insulating film includes a corresponding pair of bird's beaks having a corresponding pair of thick portions adjacent to corresponding outside edges of a corresponding gate electrode and a corresponding pair of tapering portions extending from and thinner than the corresponding pair of thick portions beneath said each gate electrode, and wherein at least said corresponding pair of tapering portions of the second kind of elements are joined by a length of said gate insulating film forming a corresponding central portion that is thinner than said corresponding pair of thick portions with a ratio of a combined length of said corresponding pair of bird's beaks and the length of the corresponding central portion having a larger value relative to said first kind of elements than relative to said second kind of elements, and further wherein each of said elements further comprises a region containing nitrogen in said surfaces of said pair of second semiconductor regions and under each of said corresponding pair of bird's beaks.

5. A semiconductor device having a plurality of elements sharing a common semiconductor substrate, each of said elements comprising:

(a) a first semiconductor region of a first conductivity type formed in said semiconductor substrate, said first semiconductor region extending to a first depth in said semiconductor substrate and having an outer surface;

(b) a pair of second semiconductor regions of a second conductivity type formed apart from each other and extending into said first semiconductor region to a second depth which is shallower than the first depth;

(c) a gate insulating film disposed on at least said outer surface of said first semiconductor region; and (d) a gate electrode disposed on said gate insulating film, wherein each gate electrode has a length measured in a direction from one of a corresponding pair of said second semiconductor regions to the other of said corresponding pair of said second semiconductor regions and at least one first kind of said elements has a gate electrode that has a shorter length than the length of the gate electrode of at least one second kind of said elements and each corresponding said gate insulating film includes a corresponding pair of bird's beaks having a corresponding pair of thick portions adjacent to corresponding outside edges of a corresponding gate electrode and a corresponding pair of tapering portions extending from and thinner than the corresponding pair of thick portions beneath said each gate electrode, and wherein at least said corresponding pair of tapering portions of the second kind of elements are joined by a length of said gate insulating film forming a corresponding central portion that is thinner than said corresponding pair of thick portions with a ratio of a combined length of said corresponding pair of bird's beaks and the length of the corresponding central portion having a larger value relative to said first kind of elements than relative to said second kind of elements, and further wherein external surfaces of said pair of second semiconductor regions in at least one of said elements are formed to be at a level higher than a level of the bottoms of said corresponding pair of bird's beaks in a region not directly beneath said bird's beaks.

6. A semiconductor device having a plurality of elements sharing a common semiconductor substrate, each of said elements comprising:

(a) a first semiconductor region of a first conductivity type formed in said semiconductor substrate, said first semiconductor region extending to a first depth in said semiconductor substrate and having an outer surface;

(b) a pair of second semiconductor regions of a second conductivity type formed apart from each other and extending into said first semiconductor region to a second depth which is shallower than the first depth;

(c) a gate insulating film disposed on at least said outer surface of said first semiconductor region; and (d) a gate electrode disposed on said gate insulating film, wherein each gate electrode has a length measured in a direction from one of a corresponding pair of said second semiconductor regions to the other of said corresponding pair of said second semiconductor regions and at least one first kind of said elements has a gate electrode that has a shorter length than the length of the gate electrode of at least one second kind of said elements and each corresponding said gate insulating film includes a corresponding pair of bird's beaks having a corresponding pair of thick portions adjacent to corresponding outside edges of a corresponding gate electrode and a corresponding pair of tapering portions extending from and thinner than the corresponding pair of thick portions beneath said each gate electrode, and wherein at least said corresponding pair of tapering portions of the second kind of elements are joined by a length of said gate insulating film forming a corresponding central portion that is thinner than said corresponding pair of thick portions with a ratio of a combined length of said corresponding pair of bird's beaks and the length of the corresponding central portion having a larger value relative to said first kind of elements than relative to said second kind of elements, and further wherein each said length of said gate insulating film forming a corresponding central portion that is thinner than said corresponding pair of thick portions that is formed as a part of any of said elements has a same thickness value.

7. The semiconductor device of claim 6, wherein at least one of said elements further comprises a semiconductor metal compound layer formed on upper surfaces of a corresponding said pair of second semiconductor regions to connect said corresponding pair of second semiconductor regions to a corresponding pair of major electrodes.

8. The semiconductor device of claim 6, wherein each said gate electrode is substantially composed of a conductive material having a thermal oxidation reaction resistance that is higher than the thermal oxidation reaction resistance of said substrate.

* * * * *

UNITED STATES PATENT AND TRADEMARK OFFICE
Certificate

Patent No. 6,281,558 B1

Patented: August 28, 2001

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Hirokazu Sayama, Tokyo, Japan; and Yukio Nishida, Tokyo, Japan.

Signed and Sealed this Twenty-fifth Day of June 2002.

TOM THOMAS
*Supervisory Patent Examiner*
Art Unit 2811